(12) United States Patent
Okudaira et al.

(10) Patent No.: US 6,278,150 B1
(45) Date of Patent: Aug. 21, 2001

(54) CONDUCTIVE LAYER CONNECTING STRUCTURE AND METHOD OF MANUFACTURING THE SAME

(75) Inventors: Tomonori Okudaira; Keiichiro Kashihara; Yoshikazu Tsunemine, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/804,530

(22) Filed: Feb. 21, 1997

(30) Foreign Application Priority Data

Sep. 5, 1996 (JP) .................................................. 8-235378

(51) Int. Cl.[7] ................................................. H01L 27/108
(52) U.S. Cl. ........................... 257/306; 257/757; 257/765
(58) Field of Search ..................................... 257/306, 310, 257/296, 303, 751, 757, 758, 761, 764, 765

(56) References Cited

U.S. PATENT DOCUMENTS

| 5,459,345 | 10/1995 | Okudaira et al. ..................... 257/310 |
| 5,554,564 | * 9/1996 | Nishioka et al. ..................... 438/278 |
| 5,668,411 | * 9/1997 | Hong et al. .......................... 257/751 |
| 5,757,612 | * 5/1998 | Acosta et al. ........................ 257/303 |
| 5,793,057 | * 8/1998 | Summerfelt .......................... 257/751 |
| 5,796,136 | * 8/1998 | Shinkawata .......................... 257/306 |
| 5,825,609 | * 10/1998 | Andricacos et al. ................. 257/303 |

FOREIGN PATENT DOCUMENTS

| 61-137367 | 6/1986 | (JP) . |
| 61-142739 | 6/1986 | (JP) . |
| 61-183942 | 8/1986 | (JP) . |
| 64-77121 | 3/1989 | (JP) . |
| 405090606 | * 4/1993 | (JP) ..................................... 257/295 |
| 7-38068 | 2/1995 | (JP) . |

OTHER PUBLICATIONS

E. Fujii, et al: "USLI DRAM Technology . . . ", international Electron Devices meeting, Dec. 13–16, 1992, pp. 267–270.
Extended Abstracts (The 42nd Spring Meeting, 1995); The Japan Society of Applied Physics and Related Societies.
Extended Abstracts (The 55th Autumn Meeting, 1994); The Japan Society of Applied Physics.
Extended Abstracts (The 56th Autumn Meeting, 1995); The Japan Society of Applied Physics.

* cited by examiner

Primary Examiner—Leo P. Picard
Assistant Examiner—Hung Van Duong
(74) Attorney, Agent, or Firm—McDermott, Will & Emery

(57) ABSTRACT

A conductive layer connecting structure has a barrier layer preventing mutual diffusion between silicon and platinum group elements even when they are heated to a high temperature. The conductive layer connecting structure includes a plug containing doped polycrystalline silicon, a barrier layer formed on the plug and containing titanium, silicon and nitrogen, and a lower electrode layer formed on the barrier layer and containing platinum.

18 Claims, 25 Drawing Sheets

CONDUCTIVE LAYER CONNECTING STRUCTURE AND METHOD OF MANUFACTURING THE SAME

BACKGROUND OF THE INVENTION

1. Field of the Invention

The present invention relates to a conductive layer connecting structure and a method of manufacturing the same, and in particular to a conductive layer connecting structure used in a semiconductor device as well as a method of manufacturing the same.

2. Description of the Background Art

Demands for semiconductor memory devices have been rapidly increased owing to rapid and wide spread of information equipments such as computers. Regarding a function, devices having a large-scale storage capacity and a high operation speed have been demanded. In view of this, technical development has been made for improving a density, a responsibility and a reliability of semiconductor memory devices.

DRAMs (Dynamic Random Access Memories) are well known as a kind of semiconductor memory devices allowing random input/output of storage information. For improving a density of the DRAM, a memory cell size must be reduced. As the memory cell size is reduced, a planar area occupied by a capacitor is also reduced. This results in reduction in quantity of charges which can be stored in the capacity (i.e., quantity of charges which can be stored in the memory cell of 1 bit). If the quantity of charges storable in the memory cell of 1 bit is lower than a predetermined value, the DRAM functioning as a storage region performs an instable operation, and the reliability lowers.

In order to prevent an instable operation of the DRAM, it is necessary to increase a capacity of the capacitor while keeping an occupied planar area within a predetermined range. As measures for increasing a capacity of the capacitor, measures such as (1) reduction in thickness of a capacitor dielectric film, and (2) increase in a dielectric constant of the capacitor dielectric film have been studied.

Reduction in thickness of the capacitor dielectric film at the above item (1) has already been achieved to a maximum extent in a usual structure using a silicon oxide film as the capacitor dielectric film. Therefore, the capacitor must have a complicated form such as a cylindrical form or a fin-like form so as to increase the capacitor capacity using the silicon oxide film as the capacitor dielectric film. However, an extremely complicated process is required for manufacturing the capacitor having the above complicated form.

Accordingly, development for increasing the capacitor dielectric constant in the above item (2) has recently been made. In order to increase the dielectric constant of the capacitor dielectric film, the capacitor dielectric film may be made of a material having a high dielectric constant which is called a high dielectric constant material. This high dielectric constant material generally has a dielectric constant which is several to hundreds of times larger than that of a silicon oxide film. By using the high dielectric constant material as the capacitor dielectric film, the capacity can be increased without complicating a form of the capacitor.

Materials called high dielectric constant materials are, for example, tantalum pentoxide ($Ta_2O_5$), lead zirconate titanate (PZT), lead lanthanum zirconate titanate (PLZT), strontium titanate (STO) and barium titanate (BTO) and barium strontium titanate (BST).

Since these high dielectric constant materials are crystallizable, platinum group elements having lattice constants close to that of high dielectric constant material is used at a portion which is in contact with the high dielectric constant material. Therefore, the capacitor of the conventional DRAM has a conductive layer connecting structure in which platinum group elements are electrically connected to a silicon substrate.

However, the platinum group elements have high reactivity with elements such as silicon. In a structure where the platinum group elements and the silicon are in contact with each other, thermal processing at a temperature of 400° C. easily causes a solid phase reaction, by which, for example, platinum silicide is formed between platinum and silicon. This changes a crystal structure of platinum, and prevents epitaxial growth of the high dielectric constant material at the surface of platinum. When the high dielectric constant material is to be formed, an oxidizing atmosphere is required, in which platinum silicide is oxidized to form a silicon oxide film at the surface of platinum silicide. This silicon oxide film has a lower dielectric constant than the high dielectric constant material, so that it reduces the dielectric constant of the dielectric film.

In order to use a high dielectric constant material as a dielectric film of a capacitor, therefore, a layer for preventing diffusion is required between a lower electrode layer made of platinum and a conductive layer made of polycrystalline silicon as well as between an upper electrode layer made of platinum and an interconnection layer on the capacitor. Generally, diffusion preventing layers are formed of titanium nitride which is widely used as barrier metal for aluminum interconnection layers. It is known that such diffusion preventing layers can property function at up to about 500° C.

The following references have disclose DRAMs having capacitors which use the high dielectric constant material as capacitor dielectric films.

(1) Japanese Patent Laying-Open No. 7-38068 (1995).

(2) International Electron Devices Meeting (IEDM) 92, pp. 267–270.

A DRAM disclosed in the above reference (1) will be described below with reference to the drawings.

FIG. 33 is a cross section showing a conductive layer connecting structure in a DRAM disclosed in Japanese Patent Laying-Open No. 7-38068. Referring to FIG. 33, isolation oxide film 1033s are formed at a surface of a silicon substrate 1031. Channel stopper regions 1035 are in contact with the lower surfaces of isolation oxide films 1033, respectively. A plurality of transfer gate transistors 1030 are formed at the surface of silicon substrate 1031 electrically isolated by isolation oxide films 1033 and channel stopper regions 1035.

Each transfer gate transistor 1030 has a gate oxide film 1021, a gate electrode 1023 and impurity regions 1025. Gate electrode 1023 is formed on a region between impurity regions 1025 with gate oxide film 1021 therebetween. A silicon oxide film 1027 covers the surface of gate electrode 1023.

There is formed a bit line 1037, which extends over the surface of silicon oxide film 1027 and is in contact with one of impurity regions 1025. Bit line 1037 and transfer gate transistor 1030 are covered with silicon oxide film 1001 and silicon nitride film 1003.

Silicon nitride film 1003 is layered over silicon oxide film 1001. Since bit line 1037 is covered with silicon oxide film 1001 and silicon nitride film 1003, it forms a buried bit line.

Silicon oxide film 1001 and silicon nitride film 1003 are provided with contact holes 1001a and 1003a reaching the surfaces of impurity regions 1025. Contact holes 1001a and 1003a are filled with plug layers 1009a which are in contact with impurity regions 1025.

Capacitors 1020 are electrically connected to impurity regions 1025 via plug layers 1009a, respectively.

Each capacitor 1020 has a lower electrode layer 1013a, a capacitor dielectric film 1015 and an upper electrode layer 1017. The lower electrode layer 1013a is formed over the surface of silicon nitride film 1003 with a barrier layer 1011a therebetween, and has a film thickness from 30 to 100 nm. Lower electrode layer 1013a is made of platinum (Pt).

Barrier layer 1011a has a three-layer structure made of titanium (Ti), titanium nitride (TiN) and titanium (Ti), and is in contact with plug layer 1009a. Each of films forming barrier layer 1011a has a thickness from 10 to 50 nm. Barrier layer 1011a prevents diffusion of impurity from plug layer 1009a made of doped polycrystalline silicon into lower electrode 1013a, and also serves to improve adhesion between silicon nitride film 1003 and lower electrode layer 1013a.

A capacitor dielectric film 1015 is formed over the surface of lower electrode layer 1013a. Capacitor dielectric film 1015 is made of a high dielectric constant material such as BST. An upper electrode layer 1017 is formed over lower electrode layer 1013a with capacitor dielectric film 1015 therebetween. Upper electrode layer 1017 is made of, e.g., platinum. Alternatively, it may be made of doped polycrystalline silicon. Capacitor 1020 is covered with a silicon oxide film 1019.

Description will be given on a method of manufacturing the conductive layer connecting structure in the DRAM shown in FIG. 33.

FIGS. 34 to 45 are cross sections showing steps of manufacturing the conductive layer connecting structure in the conventional DRAM shown in FIG. 33.

Referring to FIG. 34, transfer gate transistors 1030 having gate oxide films 1021, gate electrodes 1023 and impurity regions 1025 are formed at the region in silicon substrate 1031 isolated by isolation oxide films 1033. A step is also performed to form bit line 1037 which extends over the surface of silicon oxide film 1027 covering the surface of gate electrode 1023 and is in contact with one of impurity regions 1025.

A low pressure CVD method is performed to form silicon oxide film 1001 covering bit lines 1037 and transfer gate transistors 1030 over the entire surface of silicon substrate 1031.

Referring to FIG. 35, a CVD method is also performed to form silicon nitride film (Si$_3$N$_4$) 1003 over the surface of silicon oxide film 1001. A step is performed to from silicon oxide film 1005 over the entire surface of silicon nitride film 1003 by a CVD method.

Referring to FIG. 36, photoresist 1041 is applied to the entire surface of silicon oxide film 1005. Exposure or the like is performed to pattern photoresist 1041 for forming hole patterns 1041a located above impurity regions 1025. Anisotropic etching is effected on silicon oxide film 1005 masked by photoresist 1041. This etching forms openings 1005a at silicon oxide film 1005. Then, photoresist 1041 is removed.

Referring to FIG. 37, a CVD method is performed to form second silicon oxide film 1007 covering the inner walls of openings 1005a and the entire surface of silicon oxide film 1005. Second silicon oxide film 1007 is etched back to expose at least the surface of silicon nitride film 1003 at the bottom of each opening 1005a.

Referring to FIG. 38, the above etch back forms a rim or collar 1007a having a configuration of a side wall spacer at the side wall of opening 1005a.

Referring to FIG. 39, anisotropic etching is effected on silicon nitride film 1003 masked by rims 1007a and first silicon oxide film 1005. Thereby, contact holes 1003a exposing portions of the surface of silicon oxide film 1001 are formed.

Referring to FIG. 40, anisotropic etching is effected on silicon oxide film 1001 masked by silicon nitride film 1003. This anisotropic etching effected on silicon oxide film 1001 also removes silicon oxide film 1005 and rims 1007a. Also, this etching forms contact holes 1001a at silicon oxide film 1001.

Referring to FIG. 41, a CVD method is performed to form doped polycrystalline silicon film 1009, which has a thickness from 500 to 600 nm and fills contact holes 1001a and 1003a, over the entire surface of silicon nitride film 1003.

Referring to FIG. 42, etch back is performed on doped polycrystalline silicon film 1009 and silicon nitride film 1003 to an extent indicated by dotted line in FIG. 41. Thereby, plug layers 1009a are formed.

Referring to FIG. 43, a sputtering method is performed to form successively three layers, i.e., titanium layer, titanium nitride layer and titanium later forming barrier layer 1011 and each having a thickness from 10 to 50 nm over the whole surface defined by plug layers 1009a and silicon nitride film 1003. A sputtering method is performed to form platinum layer 1013 from 30 to 100 nm in thickness over the entire surface of barrier layer 1011.

Referring to FIG. 44, photoresist 1043 patterned into an intended configuration is formed over the surface of platinum layer 1013. Platinum layer 1013 and barrier layer 1011 masked by photoresist 1043 are anisotropically etched and patterned. This patterning forms lower electrode layer 1013 made of platinum and electrically connected to impurity regions 1025 via plug layers 1009a.

Referring to FIG. 45, a sputtering method is performed to form capacitor dielectric film 1015 made of a high dielectric constant material such as BST and covering the surface of lower electrode layer 1013a.

Referring to FIG. 33, a step is performed to form an upper electrode layer 1017 made of a platinum layer and covering lower electrode layer 1013 with capacitor dielectric film 1015 therebetween. Lower electrode layer 1013, capacitor dielectric film 1015 and upper electrode layer 1017 form capacitor 1020. Silicon oxide film 1019 is formed over capacitor 1020.

Description will now be given on problems which arise from the conductive layer connecting structure in the conventional DRAM described above.

FIG. 46 is a cross section for illustrating a problem arising from the conductive layer connecting structure in the conventional DRAM. Referring to FIG. 46, a memory cell region 2000 provided with memory cells is higher in level than a peripheral circuit region 3000. In the structure where silicon oxide film 1019 covers memory cell region 2000 and peripheral circuit region 3000, silicon oxide film 1019 has a difference in level at and near the boundary between memory cell region 2000 and peripheral circuit region 3000.

This difference in level may cause a problem in a photolithographic process, and thus is not preferable. In order to reduce the level difference, therefore, an interlayer reflow is generally performed to heat and thereby flatten silicon oxide film 1019. The interlayer reflow reduces the level difference by moving the surface of silicon oxide film 1019 to a position indicated by dotted line 1019*a*.

The interlayer reflow requires heating of silicon oxide film 1019 to a temperature from 700 to 800° C. When heated to such a high temperature, the titanium nitride layer contained in barrier layer 1011 does not generally function as a diffusion barrier. Therefore, heating to a high temperature causes mutual diffusion between silicon in plug layer 1009*b* and platinum in lower electrode layer 1013*a*, whereby the platinum and silicon react with each other to deposit platinum silicide at the surface of lower electrode layer 1013*a*. Silicon in the platinum silicide is oxidized to form a silicon oxide film. This silicon oxide film has a dielectric constant significantly lower than that of a high dielectric constant material such as PZT, so that the silicon oxide film thus produced significantly reduces a capacity of the capacitor.

SUMMARY OF THE INVENTION

The present invention has been developed to overcome the above problems, and it is an object of the invention to provide a conductive layer connecting structure having a barrier layer which prevents mutual diffusion between platinum and silicon even when the structure is heated to a high temperature.

Another object of the invention is to provide a conductive layer connecting structure having a barrier layer which prevents mutual diffusion not only between platinum and silicon but also between one conductive layer and another conductive layer even when the structure is heated to a high temperature.

A conductive layer connecting structure according to an aspect of the invention includes first, second and third conductive layers. The first conductive layer contains silicon. The second conductive layer contains metal having a high melting point, silicon and nitrogen, and is formed on the first conductive layer. The third conductive layer contains platinum group elements, and is formed on the second conductive layer. Here, the platinum group elements are selected from a group containing platinum (Pt), iridium (Ir), osmium (Os), ruthenium (Ru), rhodium (Rh), palladium (Pd) and rhenium (Re).

In the conductive layer connecting structure thus constructed, the second layer containing the high melting point metal, silicon and nitrogen is formed between the first conductive layer containing silicon and the third conductive layer containing the platinum group elements, so that mutual diffusion between the silicon and platinum group elements can be prevented even when the second conductive layer is heated to a high temperature.

Preferably, the second conductive layer has a two-layer structure of a first layer containing columnar crystals or amorphous and a second layer containing granular crystals. In this structure, the second layer containing granular crystals has a complicated grain boundaries, so that mutual diffusion which occurs between silicon and platinum through the grain boundaries is further suppressed.

Preferably, the conductive layer connecting structure in this invention further includes a fourth conductive layer formed on the third conductive layer and containing high melting point metal and nitrogen, and a fifth conductive layer formed on the fourth conductive layer and containing at least one kind of metal selected from a group consisting of aluminum, tungsten and titanium. In this structure, the fourth conductive layer containing the high melting point metal and nitrogen is formed between the third and fifth conductive layers. Therefore, the fourth conductive layer can prevent mutual diffusion between platinum in the third conductive layer and aluminum, tungsten or titanium in the fifth conductive layer.

Preferably, the high melting point metal is at least one kind of metal selected from a group containing titanium (Ti), tungsten (W), tantalum (Ta), cobalt (Co) and molybdenum (Mo).

Preferably, the first conductive layer is connected to an impurity region formed at a semiconductor substrate, and the third conductive layer forms a lower electrode layer of a capacitor. In this structure, the conductive layer connecting structure of this invention can be used in a semiconductor device having capacitors.

It is preferably that a layer containing titanium is formed between the first and second conductive layers. In this structure, adhesion between the titanium and silicon in the first conductive layer is improved, and adhesion between the titanium and high melting point metal in the second conductive layer is improved, so that adhesion between the first and second conductive layers is improved.

A conductive layer connecting structure according to another aspect of the invention includes an impurity region, a first conductive layer, a second conductive layer, a third conductive layer, a dielectric layer and a fourth conductive layer. The impurity region is formed at a main surface of the semiconductor substrate. The first conductive layer contains silicon and is connected to the impurity region. The second conductive layer contains high melting point metal, silicon and nitrogen, and is formed on the first conductive layer. The third conductive layer contains platinum group elements, and is formed on the second conductive layer. The dielectric layer is formed on the third conductive layer. The fourth conductive layer contains platinum group elements, and is formed on the dielectric layer.

In the conductive layer connecting structure having the above structure, the second conductive layer containing the high melting point metal, silicon and nitrogen is formed between the first conductive layer containing the silicon and the third conductive layer containing the platinum group elements. Therefore, mutual diffusion between the silicon and platinum can be prevented even when the second conductive layer is heated to a high temperature. Accordingly, the silicon and platinum do not react on each other, and thus a substance of a low dielectric constant such as platinum silicide or silicon dioxide is not deposited at the surface of the third conductive layer. As a result, a capacity of the capacitor does not decrease.

Preferably, the conductive layer connecting structure further includes an insulating layer formed on the semiconductor substrate and having an aperture reaching the surface of the impurity region, and the first conductive layer has a portion filling the aperture. Preferably, the third conductive layer is a lower electrode of the capacitor, and the fourth conductive layer is an upper electrode of the capacitor. In this structure, a substance having a low dielectric constant is not deposited at the surface of the lower electrode, so that the capacity of the capacitor does not decrease.

A conductive layer connecting structure according to still another aspect of the invention includes first, second and third conductive layers. The first conductive layer contains platinum group elements. The second conductive layer contains high melting point metal, silicon and nitrogen, and is formed on the first conductive layer. The third conductive layer contains at least one kind of metal selected from a group consisting of aluminum, tungsten and titanium, and is formed on the second conductive layer.

In the conductive layer connecting structure thus constructed, the second conductive layer containing high melting point metal, silicon and nitrogen is formed between the first conductive layer containing platinum group elements and the third conductive layer containing aluminum, tungsten or titanium. Therefore, it is possible to prevent mutual diffusion between the platinum group elements and aluminum, tungsten or titanium even when the second conductive layer is heated to a high temperature.

The high melting point metal is preferably at least one kind of metal selected from a group containing titanium, tungsten, tantalum, cobalt and molybdenum.

Preferably, the first conductive layer is an upper electrode of the capacitor, and the third conductive layer is an aluminum interconnection layer. In this structure, mutual diffusion does not occur between the aluminum and platinum group elements, so that the aluminum is not deposited at the surface of the capacitor. Therefore, adhesion between the upper electrode of the capacitor and the aluminum interconnection layer is not impaired.

A conductive layer connecting structure according to yet another aspect of the invention includes a first conductive layer, a second conductive layer, an insulating layer and a third conductive layer. The first conductive layer contains platinum group elements. The second conductive layer contains high melting point metal, silicon and nitrogen, and is formed on the first conductive layer. The insulating layer is formed on the second conductive layer, and has an aperture exposing the surface of the second conductive layer. The third conductive layer contains at least one kind of metal selected from a group consisting of aluminum, tungsten and titanium, is formed on the second conductive layer and is electrically connected to the second conductive layer through the aperture.

In the conductive layer connecting structure thus constructed, the second conductive layer containing the high melting point metal, silicon and nitrogen is formed between the first conductive layer containing the platinum group elements and the third conductive layer containing aluminum, tungsten or titanium. Therefore, mutual diffusion between the platinum group elements and aluminum, tungsten or titanium can be prevented even when the second conductive layer is heated to a high temperature.

Preferably, the conductive layer connecting structure of the invention further includes a plug layer filling the aperture and made of at least one kind of substance selected from a group containing tungsten, titanium and nitrides of the same, and the second and third conductive layers are electrically connected together via the plug layer. In this structure, the tungsten, titanium and nitrides of these materials have good adhesion to both the high melting point metal in the second conductive layer and the aluminum, tungsten or titanium in the third conductive layer. Therefore, the second and third conductive layers can be reliably connected together.

Preferably, a layer containing titanium is formed between the second and third conductive layers. In this structure, the layer containing titanium is located under the third conductive layer. Therefore, the second and third conductive layers, which contain silicon or the like having a good adhesion to the titanium, can be electrically connected together.

The layer containing titanium is preferably formed of a titanium layer and a titanium nitride layer. In this structure, the titanium layer and the titanium nitride layer can prevent diffusion of aluminum in the third conductive layer.

A conductive layer connecting structure according to further another aspect of the invention includes a first conductive layer, an insulating layer, a second conductive layer and a third conductive layer. The first conductive layer contains platinum group elements. The insulating layer is formed on the first conductive layer, and has an aperture exposing the surface of the first conductive layer. The second conductive layer contains high melting point metal, silicon and nitrogen, is formed on the first conductive layer and is electrically connected to the first conductive layer through the aperture. The third conductive layer contains at least one kind of metal selected from a group consisting of aluminum, tungsten and titanium, and is formed on the second conductive layer.

In the conductive layer connecting structure thus constructed, the second conductive layer containing the high melting point metal, silicon and nitrogen is formed between the first conductive layer containing the platinum group elements and the third conductive layer containing aluminum, tungsten or titanium. Therefore, mutual diffusion between the platinum group elements and aluminum, tungsten or titanium can be prevented even when the second conductive layer is heated to a high temperature.

Preferably, a layer containing titanium is formed between the second and third conductive layers. In this structure, the layer containing titanium is located under the third conductive layer. Therefore, the second and third conductive layers, which contain silicon or the like having a good adhesion to the titanium, can be electrically connected together.

The layer containing titanium is preferably formed of a titanium layer and a titanium nitride layer. In this structure, the titanium layer and the titanium nitride layer can prevent diffusion of aluminum in the third conductive layer.

A conductive layer connecting structure according to still further another aspect of the invention includes a first conductive layer, a second conductive layer and a third conductive layer. The first conductive layer contains silicon. The second conductive layer contains high melting point metal, silicon and nitrogen, and is formed on the first conductive layer. The third conductive layer contains at least one kind of metal selected from a group consisting of aluminum, tungsten and titanium, and is formed on the second conductive layer.

In the conductive layer connecting structure thus constructed, the second conductive layer containing the high melting point metal, silicon and nitrogen is formed between the first conductive layer containing the silicon and the third conductive layer containing aluminum, tungsten or titanium. Therefore, mutual diffusion between the silicon and aluminum, tungsten or titanium can be prevented even when the second conductive layer is heated to a high temperature.

Preferably, the second conductive layer has a two-layer structure of a first layer containing columnar crystals or amorphous and a second layer containing granular crystals. In this structure, the second layer containing granular crystals has complicated grain boundaries, so that mutual diffusion between silicon and platinum through the grain boundaries is further suppressed.

Preferably, the high melting point metal is at least one kind of metal selected from a group containing titanium, tungsten, tantalum, cobalt and molybdenum.

Preferably, the first conductive layer is an impurity region formed at a semiconductor substrate, and the third layer is an aluminum interconnection layer. In this case, mutual diffusion does not occur between the aluminum and silicon, so that the aluminum is not deposited at the surface of the aluminum interconnection layer. Also, the aluminum is not deposited at the surface of the impurity region. Therefore, the impurity region and the second conductive layer are reliably connected together, and the aluminum interconnection layer and the second conductive layer are reliably connected together.

Preferably, a layer containing titanium is formed between the first and second conductive layers. Since the titanium have a good adhesion to both the silicon in the first conductive layer and the aluminum in the second conductive layer, the first and second conductive layers can be reliably connected together.

A method of manufacturing a conductive layer connecting structure according to an aspect of the invention includes the following steps (1) to (3).

(1) Forming a first conductive layer containing silicon.

(2) Forming a second conductive layer containing high melting point metal, silicon and nitrogen on the first conductive layer.

(3) Forming a third conductive layer containing platinum group elements on the second conductive layer.

In the conductive layer connecting structure manufactured through the above steps, the second conductive layer containing high melting point metal, silicon and nitrogen is formed between the third conductive layer containing platinum group elements and the first conductive layer containing silicon. Therefore, mutual diffusion between the silicon and platinum group elements can be prevented even when the second conductive layer is heated to a high temperature.

The step of forming the second conductive layer preferably includes the step of forming a first layer by a reactive sputtering method, and the step of forming a second layer by a thermal nitriding method, a plasma nitriding method or an ECR (Electron Cyclotron Resonance) nitriding method. In this case, since crystals contained in the second layer form complicated grain boundaries, mutual diffusion between the silicon and aluminum through the grain boundaries can be prevented further effectively.

A method of manufacturing a conductive layer connecting structure according to a still further aspect of the invention includes the following steps (1) to (5).

(1) Forming a first conductive layer containing platinum group elements.

(2) Forming a second conductive layer containing high melting point metal, silicon and nitrogen on the first conductive layer.

(3) Forming an insulating layer on the second conductive layer.

(4) Forming an aperture reaching the surface of the second conductive layer at the insulating layer.

(5) Forming on the second conductive layer a third conductive layer containing aluminum and electrically connected to the second conductive layer through the aperture.

In the method of manufacturing the conductive layer connecting structure having the above steps, the second conductive layer containing the high melting point metal, silicon and nitrogen is formed between the first conductive layer containing the platinum group elements and the third conductive layer containing the aluminum. Therefore, mutual diffusion between the platinum group elements and aluminum can be prevented even when the second conductive layer is heated to a high temperature.

A method of manufacturing the conductive layer connecting structure according to a further aspect of the invention includes the following steps (1) to (5).

(1) Forming a first conductive layer containing platinum group elements.

(2) Forming an insulating layer on the first conductive layer.

(3) Forming at the insulating layer an aperture reaching the surface of the first conductive layer.

(4) Forming on the first conductive layer a second conductive layer electrically connected to the first conductive layer through the aperture and containing the high melting point metal, silicon and nitrogen.

(5) Forming a third conductive layer containing aluminum on the second conductive layer.

In the method of manufacturing the conductive layer connecting structure having the above steps, the second conductive layer containing the high melting point metal, silicon and nitrogen is formed between the first conductive layer containing the platinum group elements and the third conductive layer containing the aluminum. Therefore, mutual diffusion between the platinum group elements and aluminum can be prevented even when the second conductive layer is heated to a high temperature.

A method of manufacturing the conductive layer connecting structure according to a further aspect of the invention includes the following steps (1) to (5).

(1) Forming a first conductive layer containing silicon.

(2) Forming an insulating layer on the first conductive layer.

(3) Forming at the insulating layer an aperture reaching the surface of the first conductive layer.

(4) Forming on the first conductive layer a second conductive layer electrically connected to the first conductive layer through the aperture and containing the high melting point metal, silicon and nitrogen.

(5) Forming on the second conductive layer a third conductive layer containing aluminum.

In the method of manufacturing the conductive layer connecting structure having the above steps, the second conductive layer containing the high melting point metal, silicon and nitrogen is formed between the first conductive layer containing the silicon and the third conductive layer containing the aluminum. Therefore, mutual diffusion between the silicon and aluminum can be prevented even when the second conductive layer is heated to a high temperature.

The step of forming the second conductive layer preferably includes the step of forming a first layer by a reactive sputtering method, and the step of forming a second layer by a thermal nitriding method, a plasma nitriding method or an ECR nitriding method. In this case, since crystals contained in the second layer form complicated grain boundaries, mutual diffusion between the silicon and aluminum through the grain boundaries can be prevented further effectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
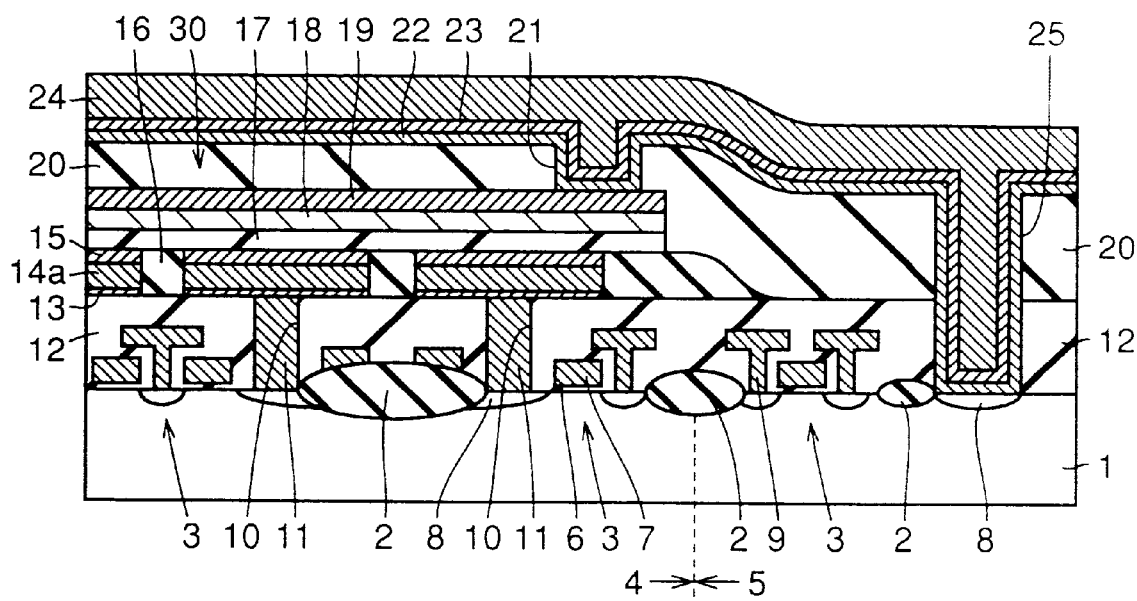
FIG. 1 is a cross section showing a conductive layer connecting structure according to an embodiment 1 of the invention.

Referring to FIG. 1, a silicon substrate 1 is provided at its surface with isolating oxide films 2 from 200 to 500 nm in thickness. A plurality of transfer gate transistors 3 are formed at the surface portions of silicon substrate 1 electrically isolated by isolating oxide films 2 from each other. The transfer gate transistors 3 for memory cells are formed at a memory cell region 4. Transfer gate transistors 3 for peripheral circuitry are formed at a peripheral circuit region 5.

Each transfer gate transistor 3 has a gate oxide film 6, a gate electrode 7 and impurity regions 8. A gate electrode 7 made of doped polycrystalline silicon is formed on a region between impurity regions 8 with gate oxide film 6 therebetween.

Bit lines 9 made of doped polycrystalline silicon are formed in contact with impurity regions 8. Bit lines 9 and transfer gate transistors 3 are covered with a silicon oxide film 12 which is made of BPSG (Boro Phospho Silicate Glass) and has a thickness from 500 to 800 nm.

Silicon oxide film 12 is provided with contact holes 10 reaching impurity regions 8. Contact holes 10 are filled with plugs 11 which are made of doped polycrystalline silicon and are in contact with impurity regions 8, respectively. There is formed a capacitor 30 which is electrically connected to impurity region 8 via plug 11.

Capacitor 30 has a lower electrode layer 15 made of platinum, a capacitor dielectric film 17 made of BST and an upper electrode layer 18 made of platinum. Lower electrode layer 15 has a thickness from 30 to 100 nm. Capacitor dielectric film 17 has a thickness from 30 to 80 nm. Upper electrode layer 18 has a thickness from 30 to 100 nm.

Lower electrode layer 15 is formed on the surface of silicon oxide film 12 and is in contact with plug 11 with a barrier layer 14*a* made of titanium silicon nitride (Ti-Si-N) and an adhesion layer 13 made of titanium therebetween. Barrier layer 14*a* has a thickness from 30 to 100 nm, and preferably from 50 to 100 nm. Adhesion layer 13 has a thickness of about 10 nm. A rimmed oxide film 16 made of silicon dioxide is formed between capacitors 30. Capacitors 30 are formed only at memory cell region 4. A barrier layer 19 made of titanium nitride is formed on upper electrode layer 18. Barrier layer 19 has a thickness from about 30 to about 100 nm.

There is formed a silicon oxide film 20 made of BPSG and covering barrier layer 19, upper electrode layer 18, capacitor dielectric film 17, rimmed oxide film 16 and silicon oxide film 12. Silicon oxide film 20 is provided with a through hole 21 reaching barrier layer 19. Silicon oxide films 12 and 20 are provided with a contact hole 25 reaching impurity region 8 in peripheral circuit region 5.

An adhesion layer 22 made of titanium covers the surface of silicon oxide film 20, the side wall of through hole 21 and the side wall of contact hole 25 and is in contact with impurity region 8 and barrier layer 19. A portion of adhesion layer 22 which is in contact with impurity region 8 is silicided to titanium silicide. Adhesion layer 22 has a thickness from 20 to 50 nm. A barrier layer 23 made of titanium nitride is formed over the surface of adhesion layer 22. Barrier layer 23 has a thickness from 20 to 50 nm. There is formed an aluminum interconnection layer 24 which covers the surface of barrier layer 23 and fills through hole 21 and contact hole 25.

A method of manufacturing the conductive layer connecting structure shown in FIG. 1 will be described below.

Figure 2:
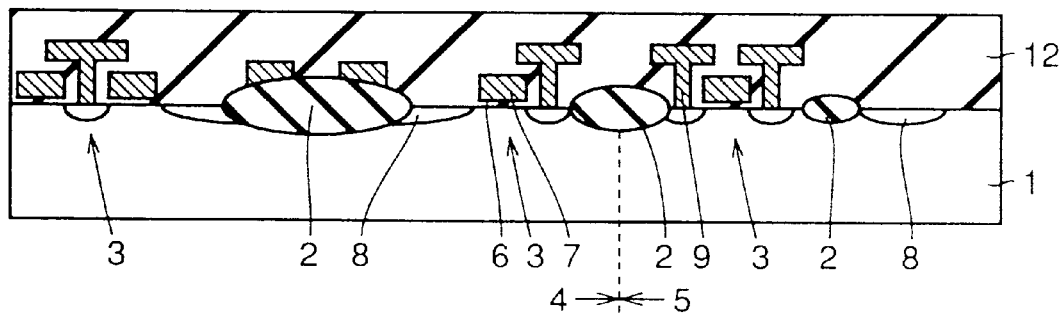
FIGS. 2 to 9 are cross sections showing 1st to 8th steps in a method of manufacturing the conductive layer connecting structure shown in FIG. 1, respectively.

Referring to FIG. 2, transfer gate transistor 3 having gate oxide films 6, gate electrodes 7 and impurity regions 8 are formed at the region in silicon substrate 1 isolated by isolation oxide films 2. Also, bit lines 9 are formed in contact with impurity regions 8. A low pressure CVD method is performed to form silicon oxide film 12 over the entire surface of silicon substrate 1 so as to cover bit lines 9 and transfer gate transistors 3.

Figure 3:
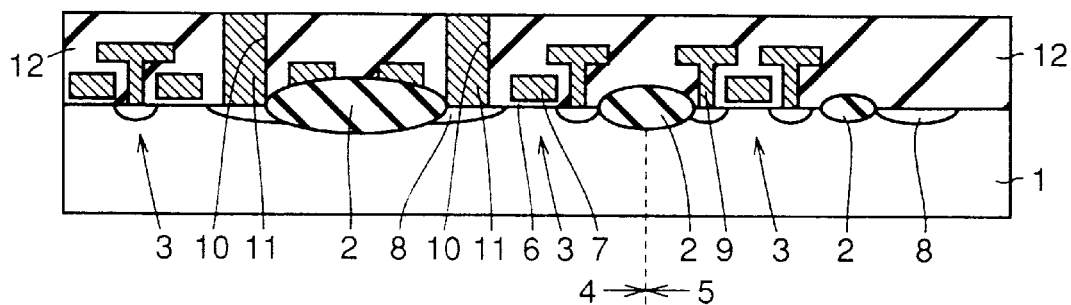

Referring to FIG. 3, a photoresist (not shown) having hole patterns is formed over the entire surface of silicon oxide film 12. Anisotropic etching is effected on silicon oxide film 12 masked with this photoresist to form contact holes 10. A CVD method is performed to deposit doped polycrystalline silicon filling contact holes 10 and covering the entire surface of silicon oxide film 12. This doped polycrystalline silicon must have a thickness which is at least 1.5 times larger than an inner diameter of contact hole 10. The entire surface of the doped polycrystalline silicon is etched back to form plugs 11.

Figure 4:
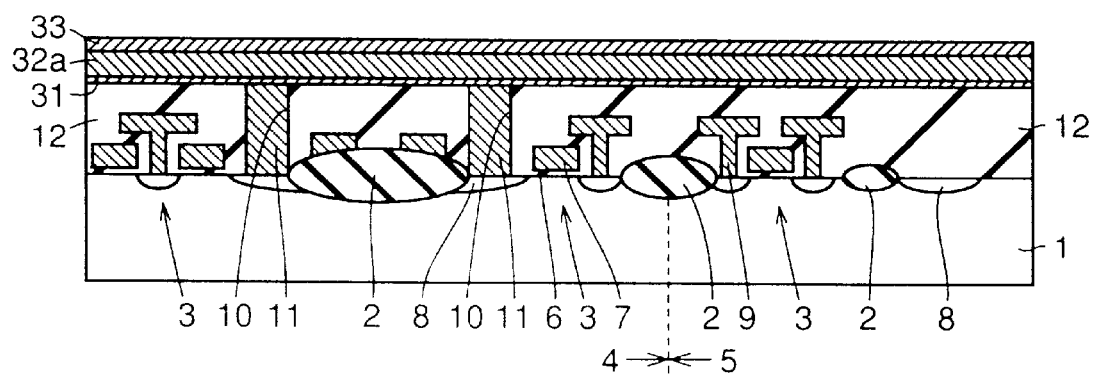

Referring to FIG. 4, a titanium layer 31 is formed on silicon oxide film 12 and plugs 11 by a sputtering method in an argon atmosphere. Titanium layer 31 has a thickness of about 10 nm. Using titanium silicide target, a sputtering method is performed in an atmosphere with a temperature from 200 to 550° C., a nitrogen partial pressure from 40 to 100% and a full pressure of 0.2 to 1.2 Pa, whereby a titanium silicon nitride layer 32a from 30 to 100 nm in thickness, and preferably from 50 to 100 nm in thickness is formed. Thereafter, thermal treatment is performed at a temperature from 600 to 950° C. in a nitrogen or ammonia atmosphere. Using platinum as a target, a sputtering method is performed in an argon atmosphere with a pressure from 0.2 to 1.2 Pa to form a platinum layer 33. Platinum layer 33 has a thickness from 30 to 100 nm.

Figure 5:
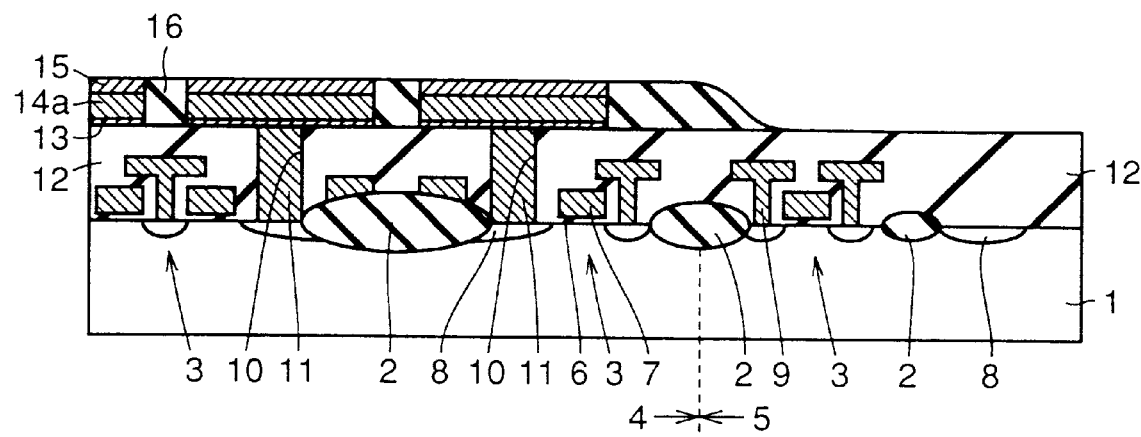

Referring to FIG. 5, sputtering etching is effected on titanium layer 31, titanium silicon nitride layer 32a and platinum layer 33 in an argon atmosphere with a pressure from 1 to 3 Pa, whereby adhesion layer 13, barrier layer 14a and lower electrode layer 15 are formed. A silicon oxide film (not shown) from 200 to 800 nm in thickness covering silicon oxide film 12 is deposited, and then is etched back by a chemical mechanical polishing method to from rimmed oxide film 16. In this step, the silicon oxide film in peripheral circuit region 5 is entirely etched. This etch back can be a usual anisotropic etching.

Figure 6:
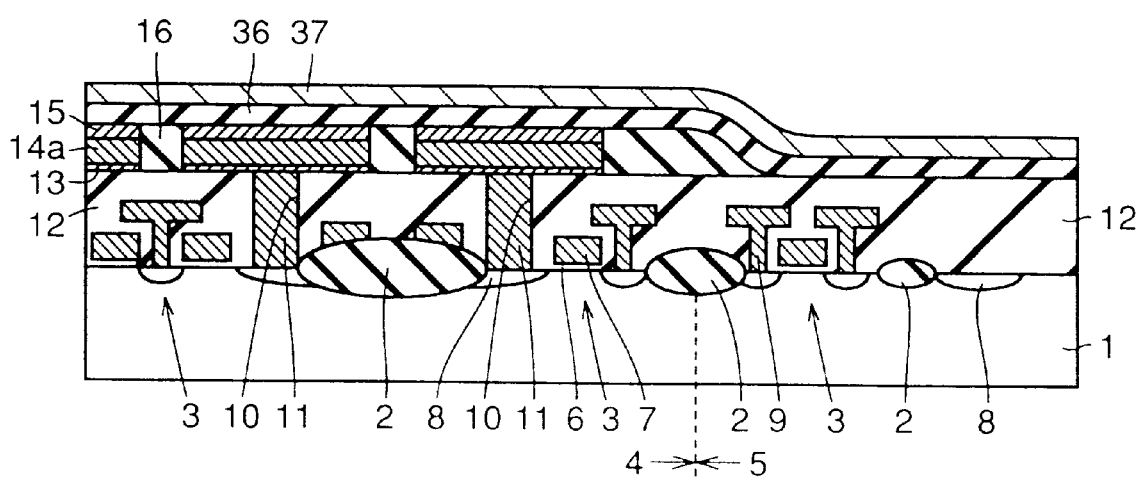

Referring to FIG. 6, a BST layer 36 is formed by a sputtering method in an argon and oxide atmosphere with a temperature from 300 to 700° C. and a full pressure from 0.5 to 2 Pa. BST layer 36 has a thickness from 30 to 80 nm. Using platinum as a target, a platinum layer 37 is formed by a sputtering method in an argon atmosphere with a temperature from 400 to 600° C. and a pressure from 0.5 to 2 Pa. Platinum layer 37 has a thickness from 30 to 100 nm.

Figure 7:
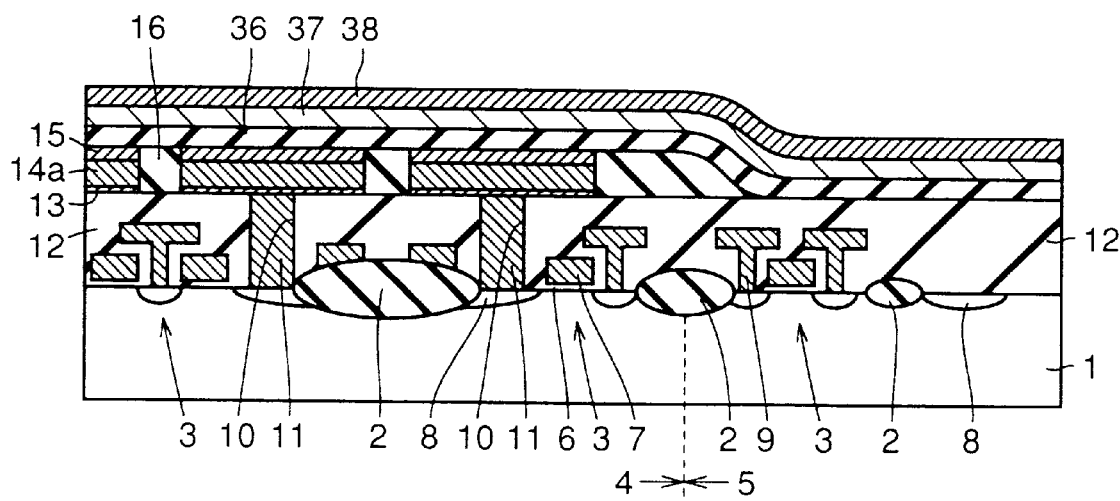

Referring to FIG. 7, a titanium nitride layer 38 from 50 to 100 nm in thickness is formed by a sputtering method in an argon atmosphere with a temperature from 300 to 600° C.

Figure 8:
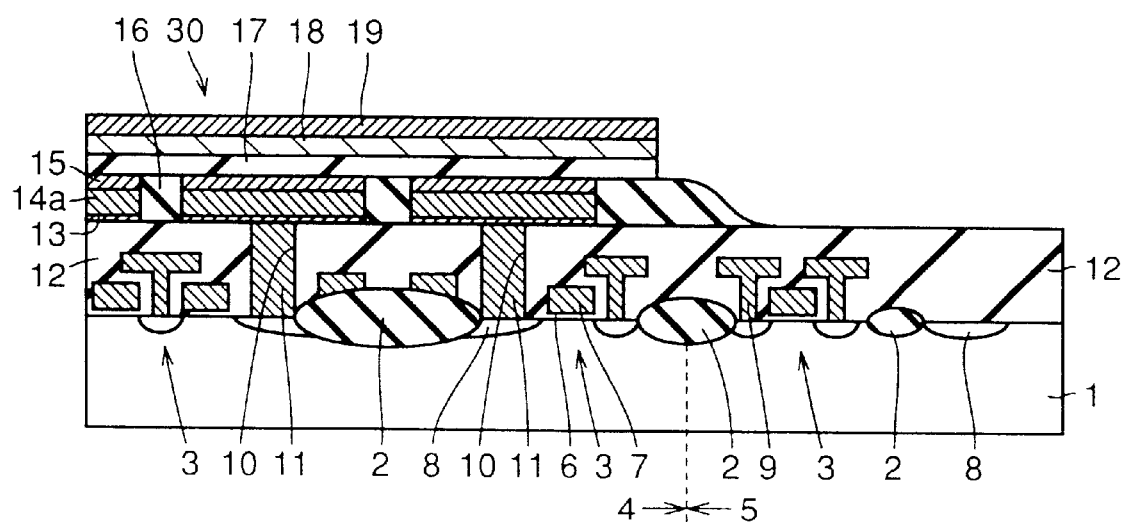

Referring to FIG. 8, a photoresist (not shown) patterned into a predetermined configuration is formed on titanium nitride layer 38, and etching is effected on titanium nitride layer 38, platinum layer 37 and BST layer 36 masked with this photoresist. Thereby, barrier layer 19, upper electrode 18 and capacitor dielectric film 17 are formed. In this manner, capacitor 30 is formed.

Figure 9:
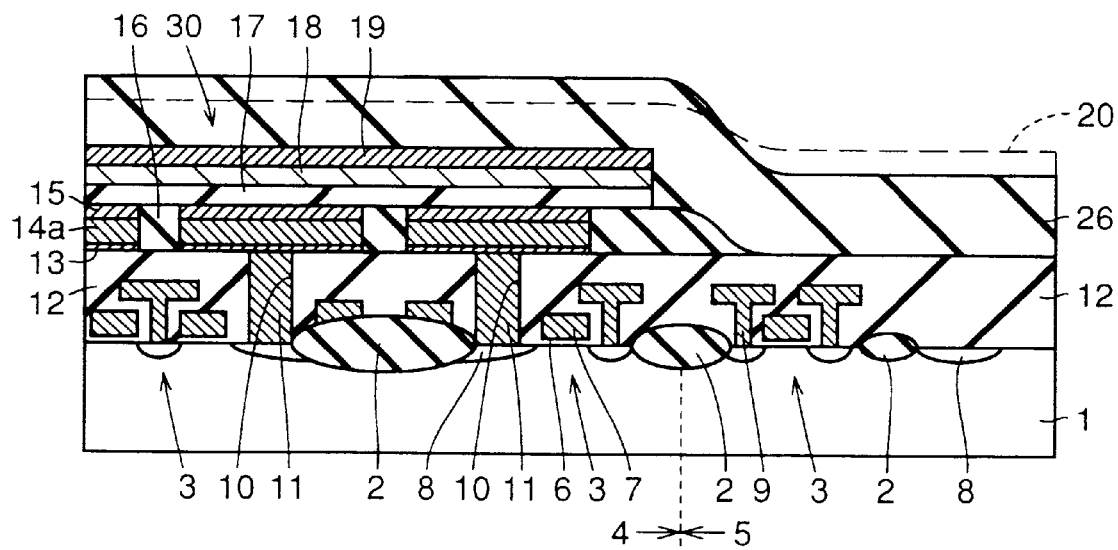

Referring to FIG. 9, a CVD method is performed to form silicon oxide film 26 made of BPSG and covering capacitor 30 and silicon oxide film 12. Silicon oxide film 26 is then kept at a temperature from 400 to 700° C. to flatten the same. This flattening by heating the silicon oxide film is called interlayer reflow. In this manner, silicon oxide film 20 is formed.

Referring to FIG. 1, a photoresist (not shown) patterned into a predetermined configuration is formed on the surface of silicon oxide film 20, and etching is effected on silicon oxide films 20 and 12 masked with this photoresist, so that through hole 21 and contact hole 25 are formed. A sputtering method is performed in an argon atmosphere to form adhesion layer 22 which covers the surface of silicon oxide film 20 as well as the side walls of through hole 21 and contact hole 25, and is in contact with barrier layer 19 and impurity region 8. Adhesion layer 22 has a thickness of about 10 nm. Barrier layer 23 made of titanium nitride is formed on adhesion layer 22 in an argon atmosphere by a sputtering method. Barrier layer 23 has a thickness from about 20 to about 100 nm. Then, aluminum interconnection layer 24 is formed by sputtering. Aluminum interconnection layer 24 has a thickness from about 200 to about 1000 nm.

In the conductive layer connecting structure of the invention which is constructed as described above, barrier layer 14a made of titanium silicon nitride is formed between plug 11 made of doped polycrystalline silicon and lower electrode layer 15 made of platinum. Barrier layer 14a can prevent mutual diffusion between silicon and platinum even when they are heated to about 700° C. Therefore, in the interlayer reflow step shown in FIG. 9, silicon oxide film 26 can be heated to a temperature of about 700° C. for flattening the same without causing mutual diffusion between the silicon and platinum. Therefore, platinum silicide and silicon dioxide are not deposited at the surface of lower electrode layer 15, so that the dielectric constant of the capacitor dielectric film does not lower. Therefore, a capacity of the capacitor does not decrease.

Since barrier layers 19 and 23 made of titanium nitride are formed between upper electrode layer 18 made of platinum and aluminum interconnection layer 24, mutual diffusion between the platinum and aluminum can be prevented. Therefore, aluminum is not deposited at the surface of upper electrode layer 18, and adhesion between upper electrode layer 18 and capacitor dielectric film 17 does not decreases.

Since there is formed adhesion layer 13 made of titanium which has a good adhesion to both plug 11 and barrier layer 14a made of doped polycrystalline silicon, barrier layer 14a and plug 11 are reliably connected together.

An effect of preventing diffusion by barrier layer 14a used in this invention will be described below with reference to specific inspection results.

In the step shown in FIG. 9, reflow was performed for 30 minutes with silicon oxide film 26 set to a temperature of 400° C. in an $H_2O$ gas. It was inspected whether platinum silicide or silicon dioxide was deposited at the surface of lower electrode layer 15. Similar inspections were performed with temperatures of 500° C., 600° C. and 700° C. Another inspection was performed in a similar manner using a barrier layer made of titanium nitride instead of barrier layer 14a. Thicknesses of barrier layer 14a and the barrier layer made of Ti-N were 50 nm. The results are shown in Table 1.

TABLE 1

| Interlayer Reflow Temperature (° C.) | 400 | 500 | 600 | 700 |
|---|---|---|---|---|
| Barrier Layer 14a (Ti-Si-N) Thickness 50 nm | O | O | O | O |
| Barrier Layer (Ti-N) Thickness 50 nm | O | O | X | X |

In Table 1, "O" represents that neither platinum silicide nor silicon dioxide was deposited at the surface of lower electrode layer 15. "X" represents that silicon dioxide or platinum silicide was deposited at the surface of lower electrode layer 15. It can be understood from Table 1 that the invention can prevent mutual diffusion between the silicon and platinum even when they are heated to a temperature of 700° C.

Embodiment 2

Figure 10:
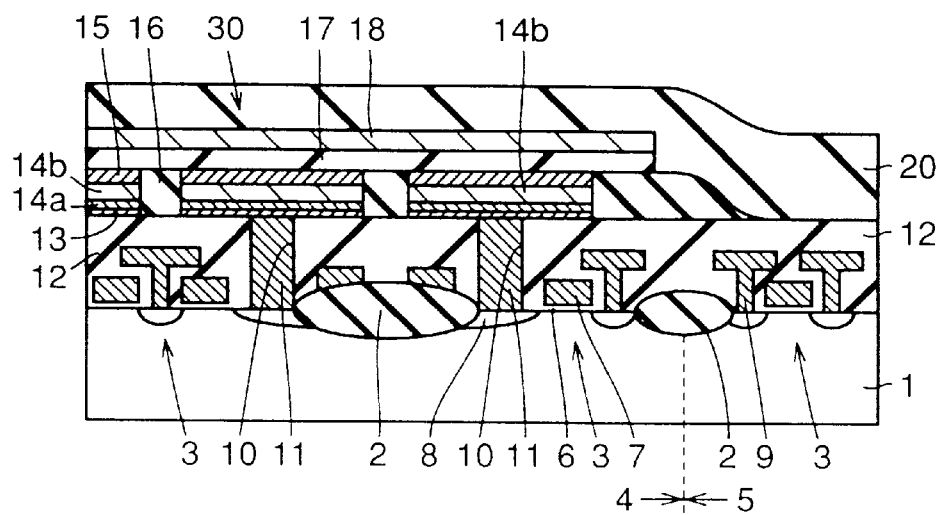
FIG. 10 is a cross section showing a conductive layer connecting structure according to an embodiment 2 of the invention.

Referring to FIG. 10, a structure of this embodiment is similar to that of the embodiment 1, and includes silicon substrate 1, isolation oxide films 2, transfer gate transistors 3, memory cell region 4, peripheral circuit region 5, gate oxide films 6, gate electrodes 7, impurity regions 8, bit lines 9, contact holes 10, plugs 11, silicon oxide film 12, lower electrode layers 15, rimmed oxide films 16, capacitor dielectric film 17, upper electrode layer 18, silicon oxide film 20 and capacitor 30.

Each lower electrode layer 15 is in contact with a barrier layer 14b which is formed of a plurality of granular monocrystals of titanium silicon nitride. Barrier layer 14b is in contact with barrier layer 14a which is formed of a plurality of columnar monocrystals of titanium silicon nitride. Barrier layer 14a has a thickness from 20 to 50 nm. Barrier layer 14b has a thickness from 20 to 70 nm.

A method of manufacturing the conductive layer connecting structure shown in FIG. 10 will now be described below.

Figure 11:
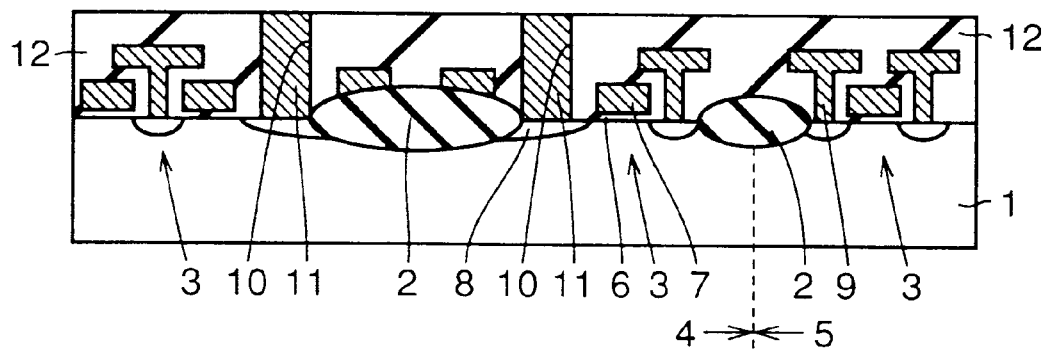
FIGS. 11 and 12 are cross sections showing 1st and 2nd steps in a method of manufacturing the conductive layer connecting structure shown in FIG. 10, respectively.

Referring to FIG. 11, steps are performed to form isolating oxide films 2, transfer gate transistors 3, silicon oxide film 12, contact holes 10, plugs 11 and bit lines 9 which are similar to those in the embodiment 1 shown in FIG. 3.

Figure 12:
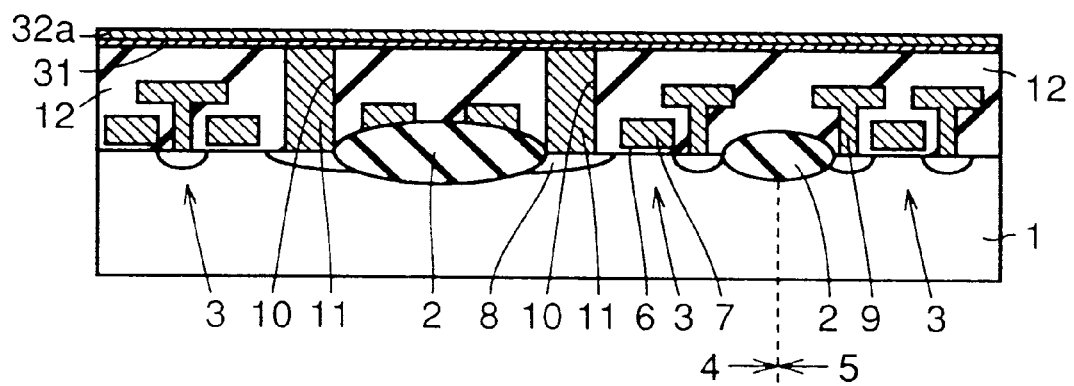

Referring to FIG. 12, a sputtering method is performed in an argon atmosphere to form titanium layer 31 of about 10 nm in thickness. Using titanium silicide target, titanium silicon nitride layer 32a is formed by a sputtering method in an atmosphere of a nitrogen partial pressure from 40 to 100%, a temperature from 200 to 550° C. and a full pressure from 0.2 to 1.2 Pa. Titanium silicon nitride layer 32a has a thickness from 20 to 50 nm. This method of forming a nitride by sputtering in a nitrogen atmosphere is called a reactive sputtering method. Thereafter, a heat treatment is performed at a temperature from 600 to 950° C. in a nitrogen or ammonia atmosphere.

Figure 13:
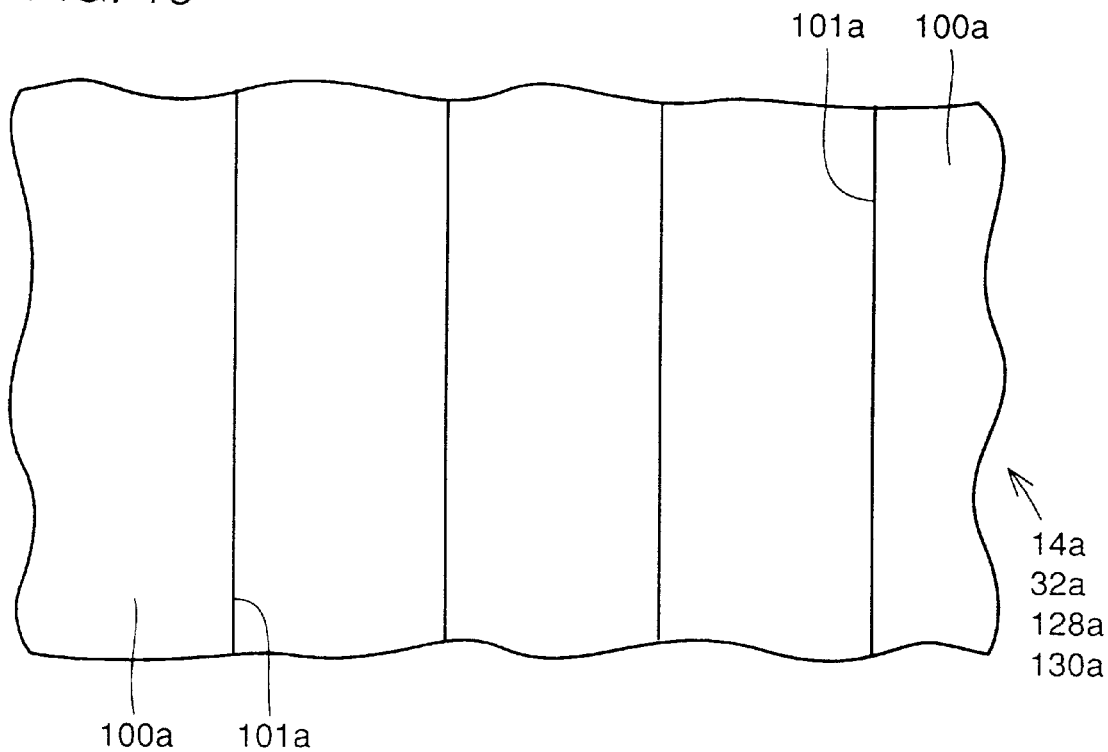
FIG. 13 is a cross section showing a titanium silicon nitride layer of a first form.

Referring to FIG. 13, titanium silicon nitride layer 32a is formed of a large number of monocrystals of titanium silicon nitride, and monocrystals 100a have grown into longitudinal columnar forms. Therefore, grain boundaries 101a extend longitudinally and substantially straight. The titanium silicon nitride in titanium silicon nitride layer 32a is amorphous in some cases. If the titanium silicon nitride is amorphous, grain boundaries 101a are not exist.

Figure 14:
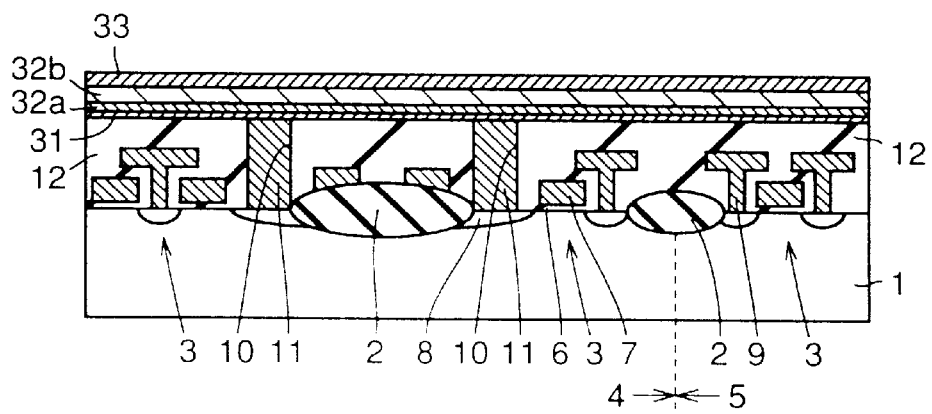
FIG. 14 is a cross section showing a 3rd step in the method of manufacturing the conductive layer connecting structure shown in FIG. 10.

Referring to FIG. 14, titanium silicide target is used, and a sputtering method is performed in an argon atmosphere with a pressure from 0.2 to 1.2 Pa to form a titanium silicide layer from 20 to 70 nm in thickness. Then, the titanium silicide layer is nitrided by a heat treatment at a temperature from 700 to 900° C. in a nitrogen or ammonia atmosphere, whereby a titanium silicon nitride layer 32b is formed. This method in which non-nitride is thermally processed in nitrogen or ammonia for thermal nitriding it is called a thermal nitriding method. Platinum layer 33 which is the same as that of the embodiment 1 shown in FIG. 4 is formed on titanium silicon nitride layer 32b.

Figure 15:
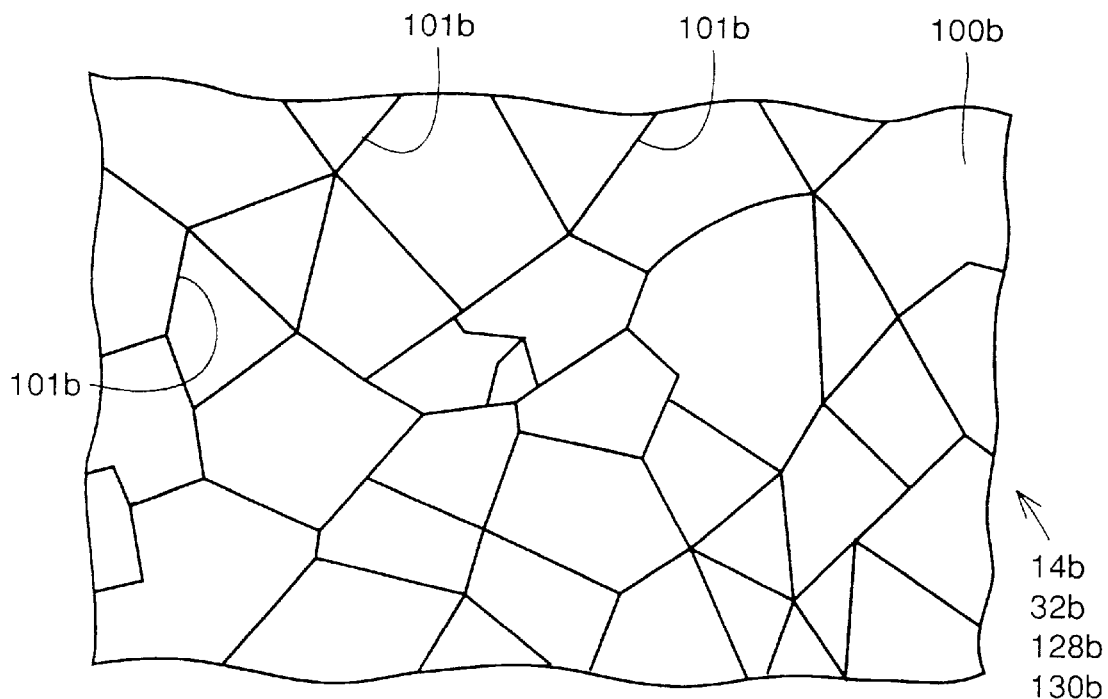
FIG. 15 is a cross section showing a titanium silicon nitride layer of a second form.

Referring to FIG. 15, titanium silicon nitride layer 32b is formed of a large number of monocrystals 100b of titanium silicon nitride, which are granular. Therefore, grain boundaries 101b are complicated.

Figure 16:
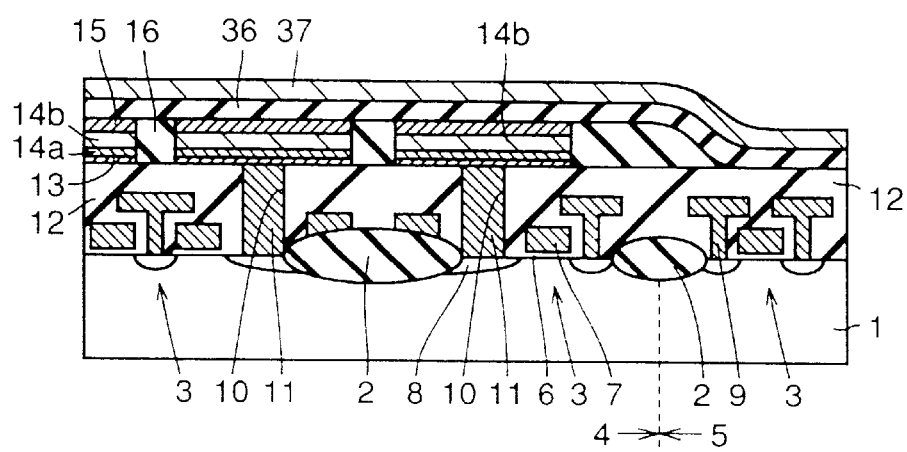
FIGS. 16 and 17 are cross sections showing 4th and 5th steps in the method of manufacturing the conductive layer connecting structure shown in FIG. 10, respectively.

Referring to FIG. 16, platinum layer 33, titanium silicon nitride layers 32a and 32b, and titanium layer 31 are patterned into predetermined configurations to form adhesion layer 13, barrier layers 14a and 14b, and lower electrode layer 15. Then, rimmed oxide film 16 is formed. Steps are performed to form BST layer 36 and platinum layer 37 similarly to those in the embodiment 1 shown in FIG. 6.

Figure 17:
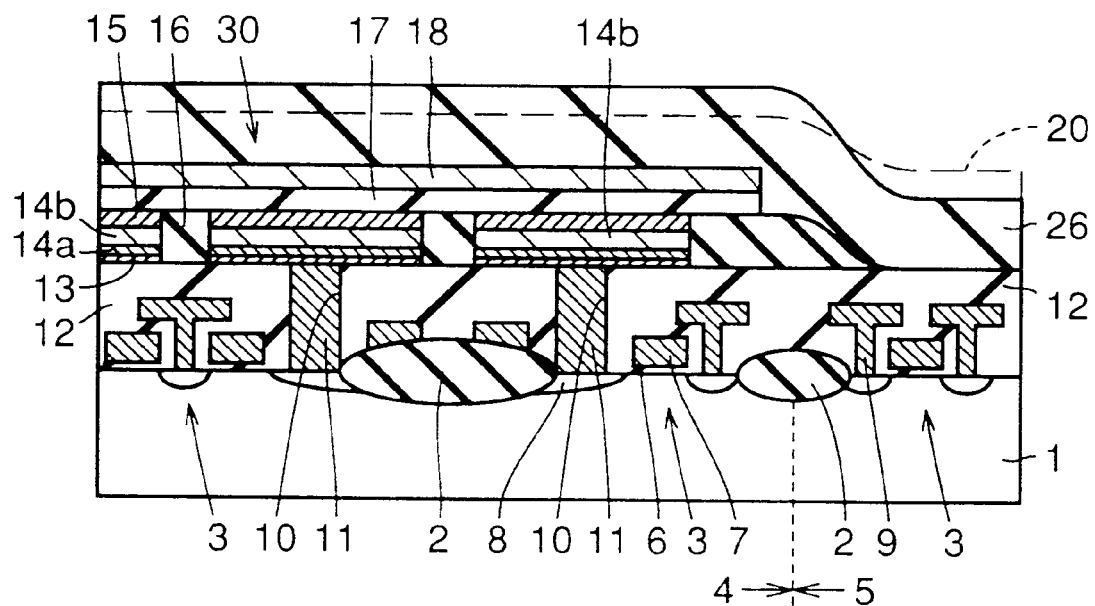

Referring to FIG. 17, BST layer 36 and platinum layer 37 are patterned into predetermined configurations to from capacitor dielectric film 17 and upper electrode layer 18. Similarly to the step in the embodiment 1 shown in FIG. 9, interlayer reflow is effected on silicon oxide film 26.

In a conductive layer connecting structure of the invention having the above structure, barrier layers 14a and 14b made of titanium silicon nitride are formed between plug 11 made of polycrystalline silicon and lower electrode layer 15 made of platinum. Therefore, barrier layer 14b made of titanium silicon nitride has a very complicated grain boundaries as shown in FIG. 15, so that mutual diffusion between silicon and platinum, which may occur through the grain boundaries, is suppressed. Therefore, neither platinum silicide nor silicon dioxide is deposited at the surface of lower electrode layer 15, and thus a capacity of the capacitor does not decrease. The titanium silicide layer is formed in the step shown in FIG. 14, and then is thermally processed in the nitrogen or ammonia atmosphere to form barrier layer 14b. Thus, the thermal nitriding method is performed. Thereby, the barrier layer 14b can have complicated grain boundaries.

An effect of preventing diffusion by barrier layers 14a and 14b used in this invention will be described below with reference to specific inspection results.

In the step shown in FIG. 17, interlayer reflow was performed on silicon oxide film 26 at a temperature of 400° C. in an $H_2O$ gas. It was inspected whether platinum silicide or silicon dioxide was deposited at the surface of lower electrode layer 15. Similar inspections were performed with temperatures of 500° C., 600° C., 700° C. and 750° C. A nitrogen atmosphere was used for the inspection at 750° C. Another inspection was performed in a similar manner using barrier layers made of titanium nitride instead of barrier layers 14a and 14b. Thicknesses of barrier layers 14a and 14b were 30 nm, and thickness of the barrier layer made of Ti-N is 60 nm. The results are shown in Table 2.

TABLE 2

| Interlayer Reflow Temperature (° C.) | 400 | 500 | 600 | 700 | 750 |
|---|---|---|---|---|---|
| Barrier Layers 14a (Ti-Si-N) Thickness 30 nm Barrier Layers 14b (Ti-Si-N) Thickness 30 nm | ◯ | ◯ | ◯ | ◯ | ◯ |
| Barrier Layers (Ti-N) Thickness 60 nm | ◯ | ◯ | X | X | X |

In Table 2, "◯" represents that neither platinum silicide nor silicon dioxide was deposited at the surface of lower electrode layer 15. In Table 2, "X" represents that platinum silicide or silicon dioxide was deposited at the surface of lower electrode layer 15. It can be understood from Table 2 that the invention can prevent mutual diffusion between the silicon and platinum even when they are heated to a temperature of 750° C.

Embodiment 3

Figure 18A:
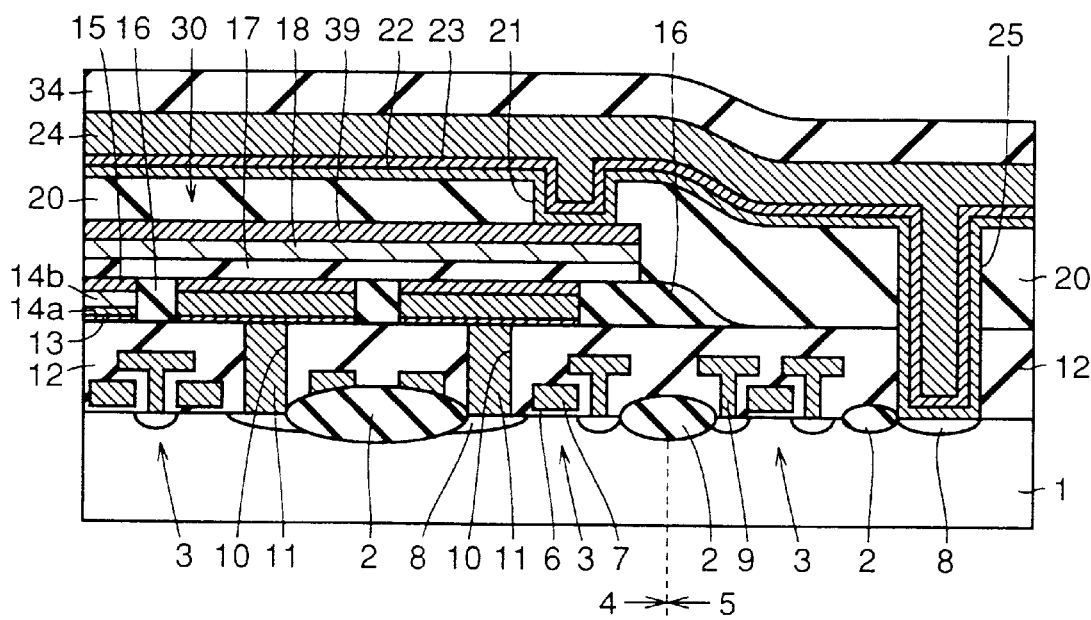
FIG. 18A is a cross section showing a conductive layer connecting structure of a first form according to an embodiment 3 of the invention.

Referring to FIG. 18A, a structure of this embodiment includes silicon substrate 1, isolation oxide films 2, transfer gate transistors 3, memory cell region 4, peripheral circuit region 5, gate oxide films 6, gate electrodes 7, impurity regions 8, bit lines 9, contact holes 10, plugs 11, silicon oxide film 12, adhesion layers 13, barrier layers 14a and 14b, lower electrode layers 15, rimmed oxide films 16, capacitor dielectric film 17, upper electrode layer 18 and capacitor 30, which are the same as those in FIG. 10 bearing the same names. A barrier layer 39 made of titanium silicon nitride is formed on upper electrode layer 18. Silicon oxide film 20 made of BPSG covers barrier layer 39, upper electrode layer 18, capacitor dielectric film 17, rimmed oxide film 16 and silicon oxide film 12. Through hole 21 reaching barrier layer 19 is formed at silicon oxide film 20.

Contact hole 25 reaching impurity region 8 at peripheral circuit region 5 is formed at silicon oxide films 12 and 20. Adhesion layer 22 made of titanium covers the surface of silicon oxide film 20, the side wall of through hole 21 and the side wall of contact hole 25, and is in contact with impurity region 8 and barrier layer 19. A portion of adhesion layer 22 which is in contact with impurity region 8 is silicided to titanium silicide. Adhesion layer 22 has a thickness from 20 to 50 nm. Barrier layer 23 made of titanium nitride is formed over the surface of adhesion layer 22. Barrier layer 23 has a thickness from 20 to 50 nm. There is formed aluminum interconnection layer 24 which covers the surface of barrier layer 23 and fills through hole 21 and contact hole 25. Aluminum interconnection layer 24 is covered with a silicon oxide film 34.

A method of manufacturing the conductive layer connecting structure shown in FIG. 18A will be described below.

Figure 19:
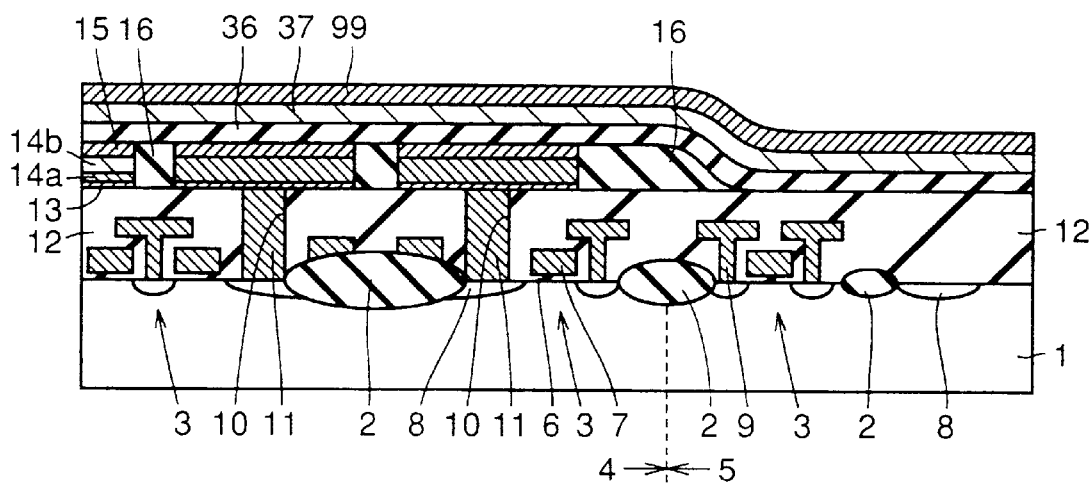
FIGS. 19 and 20 are cross sections showing 1st and 2nd steps in a method of manufacturing the conductive layer connecting structure shown in FIGS. 18A and 18B, respectively.

Referring to FIG. 19, steps preceding or corresponding to the step of forming platinum layer 37 shown in FIG. 16 are performed similarly to the embodiment 2. Then, using a titanium silicide target, a sputtering method is performed with a nitrogen partial pressure from 40 to 100%, a temperature from 200 to 550° C. and a full pressure from 0.2 to 1.2 Pa, whereby a titanium silicon nitride layer 99 is formed. Titanium silicon nitride layer 99 is thermally processed in a nitrogen or ammonia atmosphere at a temperature from 700 to 900° C.

Figure 20:
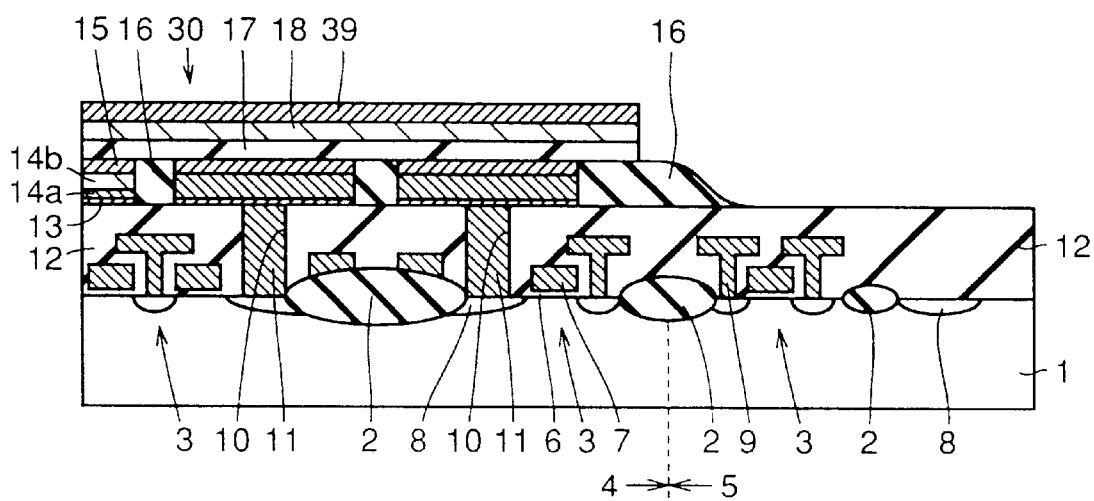

Referring to FIG. 20, titanium silicon nitride layer 99, platinum layer 37 and BST layer 36 are patterned into predetermined configurations to form barrier layer 39 made of titanium silicon nitride, upper electrode layer 18 and capacitor dielectric film 17, respectively. Thereby, capacitor 30 is formed.

Referring to FIG. 18A, steps are performed to from silicon oxide film 20, through hole 21, contact hole 25, adhesion layer 22, barrier layer 23 and aluminum interconnection layer 24 similar to those in the embodiment 1 shown in FIG. 1. A CVD method is performed to form silicon oxide film 34 at a temperature of 400° C., whereby the conductive layer connecting structure is completed.

The conductive layer connecting structure of the embodiment 3 of the invention described above includes barrier layer 39, which is made of titanium silicon nitride and is formed on upper electrode layer 18, in addition to the structure of the embodiment 2. Therefore, as compared with the case where the barrier layer made of titanium nitride is formed on upper electrode layer 18 as shown in FIG. 18, mutual diffusion between the platinum and the aluminum in aluminum interconnection layer 24 can be prevented to a higher extent even when they are heated to a higher temperature (400° C.). Therefore, aluminum is not deposited at the surface of upper electrode layer 18. Therefore, adhesion between upper electrode layer 18 and capacitor dielectric film 17 is improved, and it is possible to prevent a leak current, which may be caused by separation of upper electrode layer 18 from capacitor dielectric film 17.

Figure 18B:
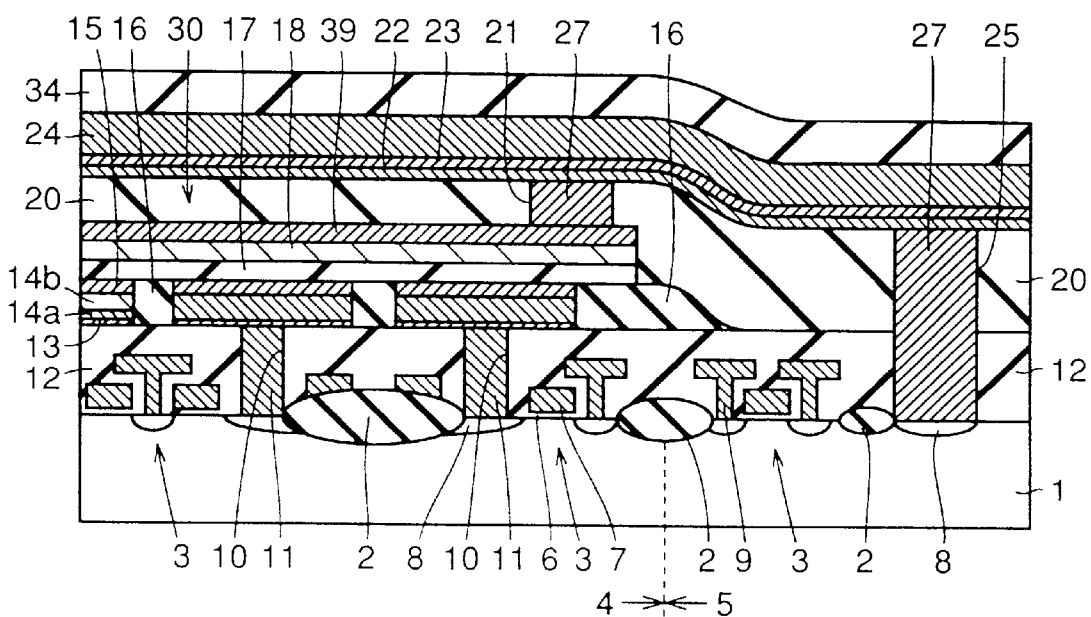
FIG. 18B is a cross section showing a conductive layer connecting structure of a second form according to the embodiment 3 of the invention.

Referring to FIG. 18B, through hole 21 and contact hole 25 may be filled with tungsten plugs 27 formed by a CVD method, and adhesion layer 22 may be formed in contact with tungsten plugs 27. Tungsten plugs 27 may be replaced with plugs made of tungsten nitride or titanium nitride.

Embodiment 4

A conductive layer connecting structure shown in FIG. 21 differs from that shown in FIG. 18A in the following structure. In the structure shown in FIG. 18A, barrier layer 39 made of titanium silicon nitride is formed between upper electrode layer 18 and adhesion layer 22, and barrier layer 23 is made of titanium nitride. Meanwhile, in the structure shown in FIG. 21, a barrier layer 28a made of titanium silicon nitride is formed between adhesion layer 22 and aluminum interconnection layer 24, and a barrier layer made of titanium nitride is not employed.

A method of manufacturing the conductive layer connecting structure shown in FIG. 21 will be described below.

Figure 22:
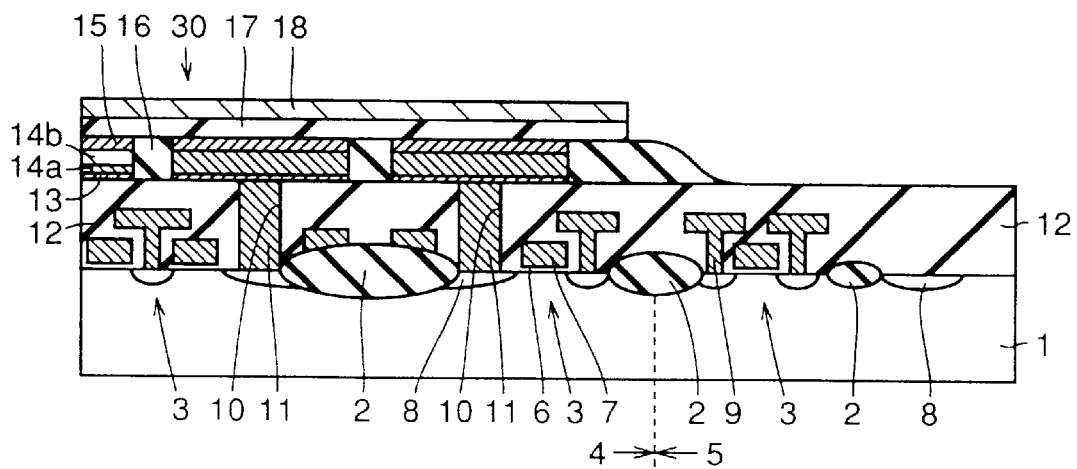
FIGS. 22 and 23 are cross sections showing 1st and 2nd steps in a method of manufacturing the conductive layer connecting structure shown in FIG. 21, respectively.

Referring to FIG. 22, steps preceding or corresponding to the step of forming BST layer 36 and platinum layer 37 shown in FIG. 16 are performed similarly to the embodiment 2. These layers are patterned into predetermined configurations by plasma etching to form upper electrode layer 18 and capacitor dielectric film 17, respectively.

Figure 23:
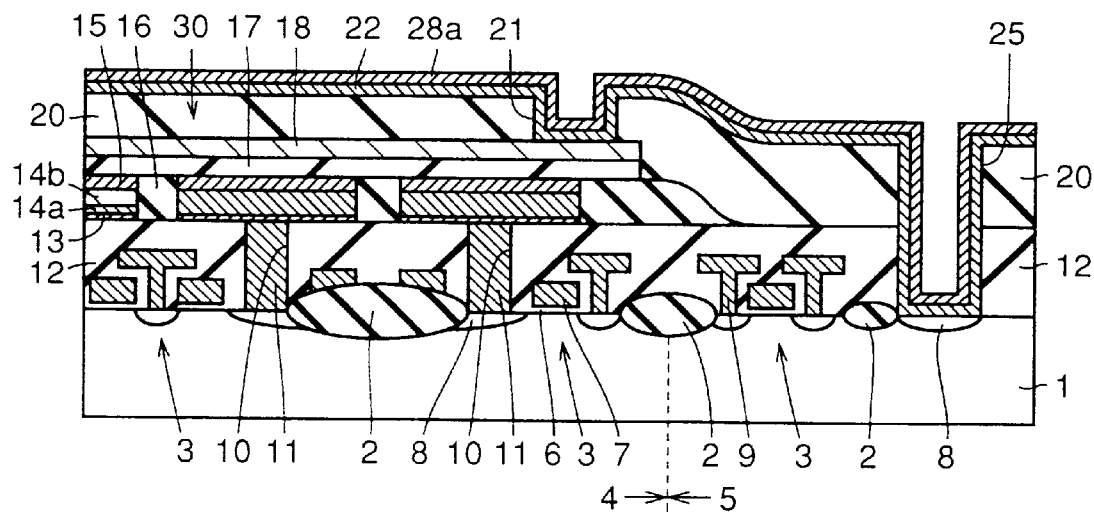

Referring to FIG. 23, silicon oxide film 20 is formed by the step similar to that in the embodiment 2 shown in FIG. 17. Through hole 21 and contact hole 25 are formed at silicon oxide film 20. A sputtering method is performed in an argon atmosphere to form adhesion layer 22 which is made of titanium, covers the surface of silicon oxide film 20 and side walls of through hole 21 and contact hole 25 and is in contact with upper electrode layer 18 and impurity region 8. Adhesion layer 22 has a thickness of about 10 nm. Using titanium silicide target, a sputtering method is performed with a nitrogen partial pressure from 40 to 100%, a temperature from 200 to 550° C. and a full pressure from 0.2 to 1.2 Pa, and thereby barrier layer 28a made of titanium silicon nitride and having a thickness from 30 to 100 nm is formed. Barrier layer 28a is thermally processed in a nitrogen or ammonia atmosphere at 700 to 900° C. In this processing, a portion of titanium layer 22 which is in contact with impurity region 8 is silicided.

Figure 21:
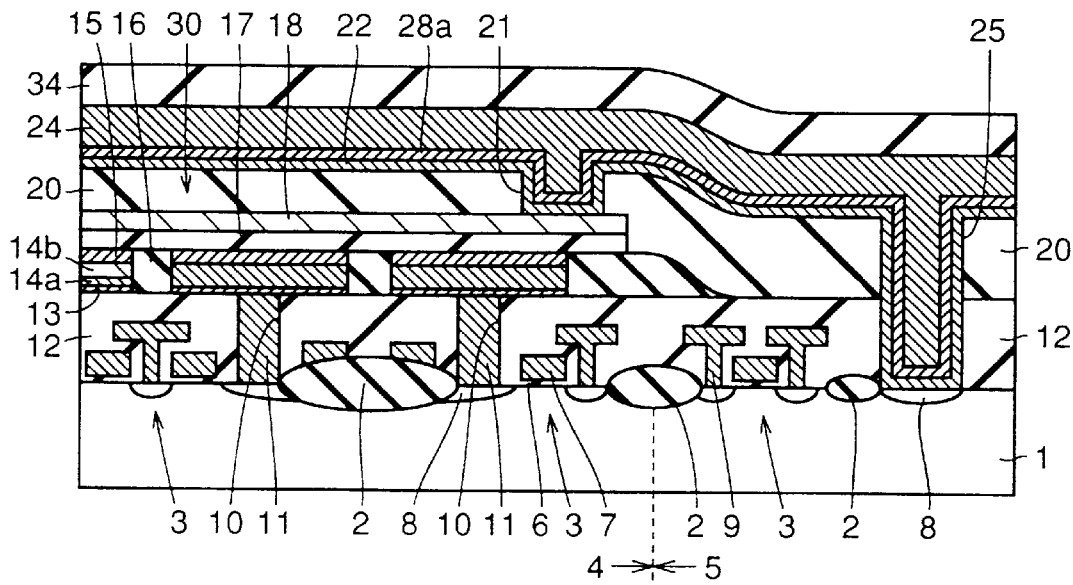
FIG. 21 is a cross section showing a conductive layer connecting structure according to an embodiment 4 of the invention.

Referring to FIG. 21, a sputtering method is performed to form an aluminum interconnection layer 24 from 200 to 1000 nm in thickness. Then, a CVD method is performed at a temperature of 400° C. to form silicon oxide film 34.

The conductive layer connecting structure of the embodiment 4 of the invention described above can achieve the following effect in addition to the effect of the embodiment 3. In the step shown in FIG. 22, capacitor dielectric film 17 and upper electrode layer 18 are formed by the plasma etching. The time for this etching is shorter than the time for etching capacitor dielectric film 17, upper electrode layer 18 and the barrier layer made of titanium silicon nitride and formed on upper electrode layer 18. More specifically, the etching time for the structure not provided with the barrier layer made of titanium silicon nitride is ⅙ to ½ of the etching time for the structure provided with the barrier layer. Since lower electrode layer 15 and upper electrode layer 18 are isolated from each other by capacitor dielectric film 17, a large potential difference would be present between upper and lower electrode layers 18 and 15 for a long time, if the etching time were long. This potential difference would cause insulation breakdown of capacitor dielectric film 17. In the manufacturing method of the embodiment 4, however, the etching time can be short, so that such insulation breakdown can be suppressed.

In the step of etching barrier layer 28a made of titanium silicon nitride, upper electrode layer 18 electrically connected to barrier layer 28a bears the potential equal to that of silicon substrate 1, because barrier layer 28a is in contact with silicon substrate 1. Since the lower electrode layer 15 is electrically connected to silicon substrate 1, they bear the equal potentials. Therefore, a potential difference is not present between upper and lower electrode layers 18 and 15, and thus a long etching time does not cause insulation breakdown.

Embodiment 5

Similarly to the structure of the embodiment 1 shown in FIG. 1, a structure of this embodiment includes silicon substrate 1, isolation oxide films 2, transfer gate transistors 3, gate oxide films 6, gate electrodes 7, impurity regions 8, bit lines 9, silicon oxide film 12 and contact holes 10. There is formed an adhesion layer 122 which is made of titanium, covers silicon oxide film 12 and the side walls of contact holes 10, and is in contact with impurity regions 8. A barrier layer 128a made of titanium silicon nitride covers adhesion layer 122. There is also formed an aluminum interconnection layer 129 covering barrier layer 128a and filling contact holes 10. Silicon oxide film 20 made of BPSG covers silicon oxide 12, aluminum interconnection layer 129, barrier layer 128a and adhesion layer 122. Silicon oxide film 20 is provided with through hole 21 reaching aluminum interconnection layer 129. Contact hole 25 reaches silicon oxide films 12 and 22 and impurity region 8.

Adhesion layer 22 made of titanium covers the surface of silicon oxide film 20, the side wall of through hole 21 and the side wall of contact hole 25, and is in contact with impurity region 8 and aluminum interconnection layer 129. A portion of adhesion layer 22 which is in contact with impurity region 8 is silicided to titanium silicide. Barrier layer 28a made of titanium silicon nitride is formed on the surface of adhesion layer 22. Aluminum interconnection layer 24 covers the surface of barrier layer 28a, and fills through hole 21 and contact hole 25.

A method of manufacturing the conductive layer connecting structure shown in FIG. 24 will be described below.

Figure 25:
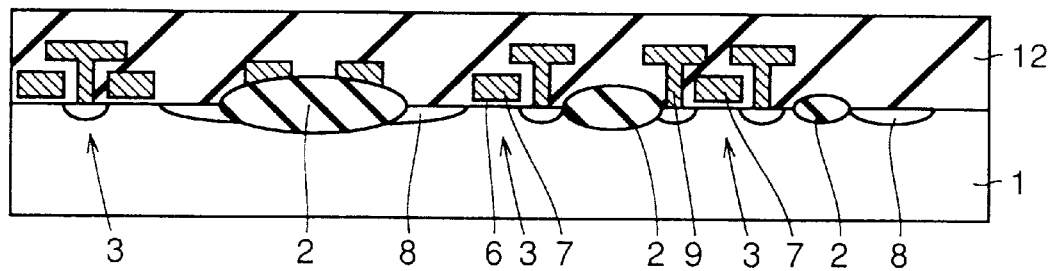
FIGS. 25 to 29 are cross sections showing 1st to 5th steps in a method of manufacturing the conductive layer connecting structure shown in FIG. 24, respectively.

Referring to FIG. 25, isolating oxide films 2, transfer gate transistors 3, bit lines 9 and silicon oxide film 21 are formed in a manner similar to that in the embodiment 1 shown in FIG. 2.

Figure 26:
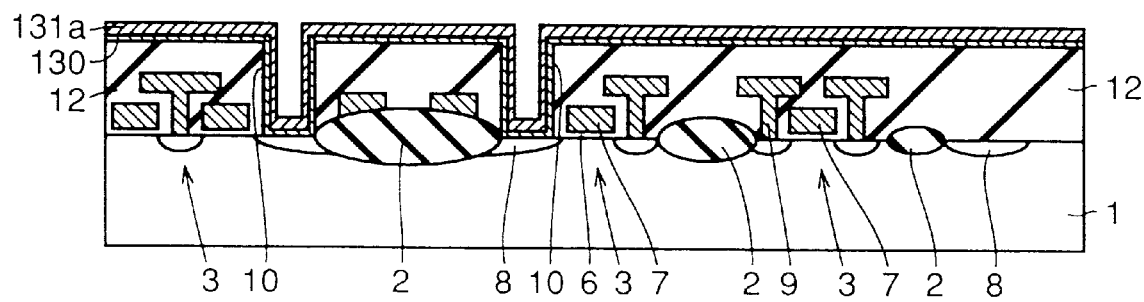

Referring to FIG. 26, a step is performed to form contact holes 10 at silicon oxide film 12. A sputtering method is performed in an argon atmosphere to from adhesion layer 130 made of titanium. Adhesion layer 130 has a thickness of about 10 nm. Using titanium silicide target, barrier layer 131a made of titanium silicon nitride is formed by a sputtering method with a nitrogen partial pressure from 40 to 100%, a temperature from 200 to 550° C. and a full pressure from 0.2 to 1.2 Pa, and then is thermally processed in a nitrogen or argon atmosphere at a temperature from 700 to 900° C. Barrier layer 131a has a thickness from 20 to 50 nm.

Figure 27:
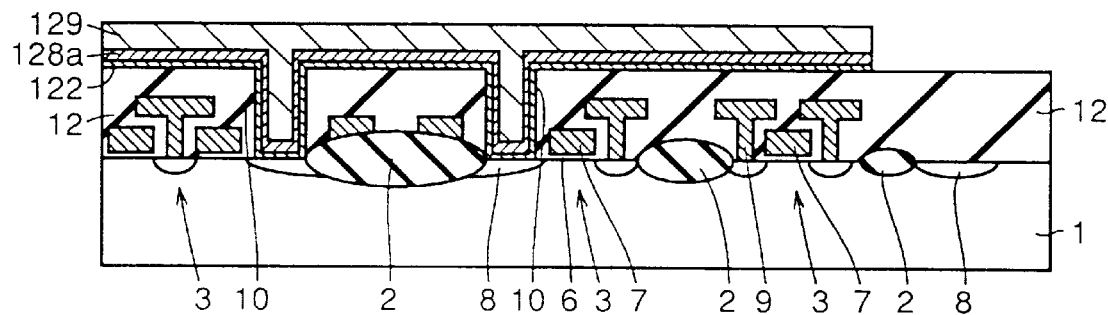

Referring to FIG. 27, sputtering is performed to form an aluminum layer from 200 to 1000 nm in thickness covering barrier layer 131a and filling contact hole 10, and reflow is effected on the aluminum layer at a temperature of 490° C. Then, the aluminum layer, barrier layer 131a and adhesion layer 130 are patterned into predetermined configurations, whereby aluminum interconnection layer 129, barrier layer 128a and adhesion layer 122 are formed.

Figure 28:
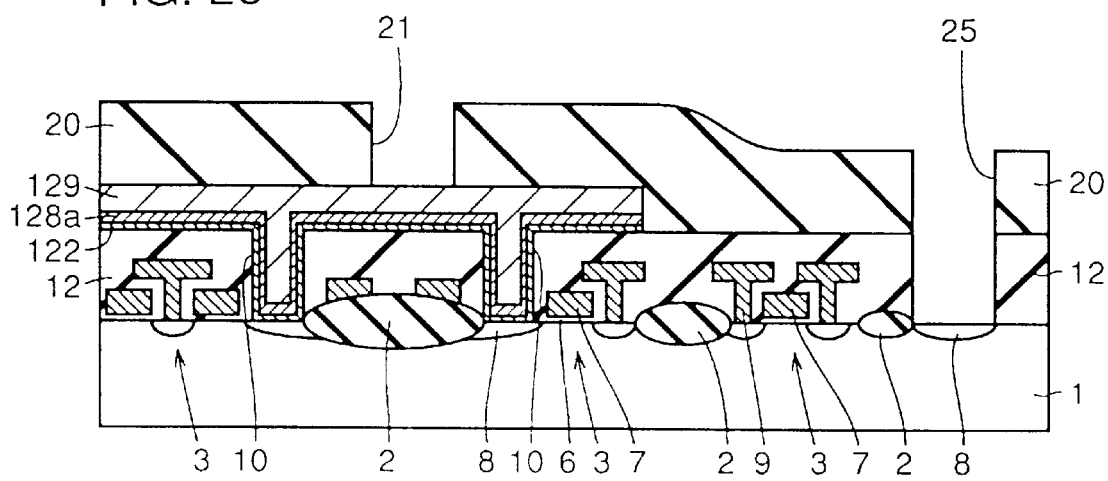

Referring to FIG. 28, a step is performed to form silicon oxide film 20 covering aluminum interconnection layer 129, barrier layer 128a, adhesion layer 122 and silicon oxide film 12, and reflow is performed at a temperature of 700° C. Through hole 21 and contact hole 25 are formed at silicon oxide film 20.

Figure 29:
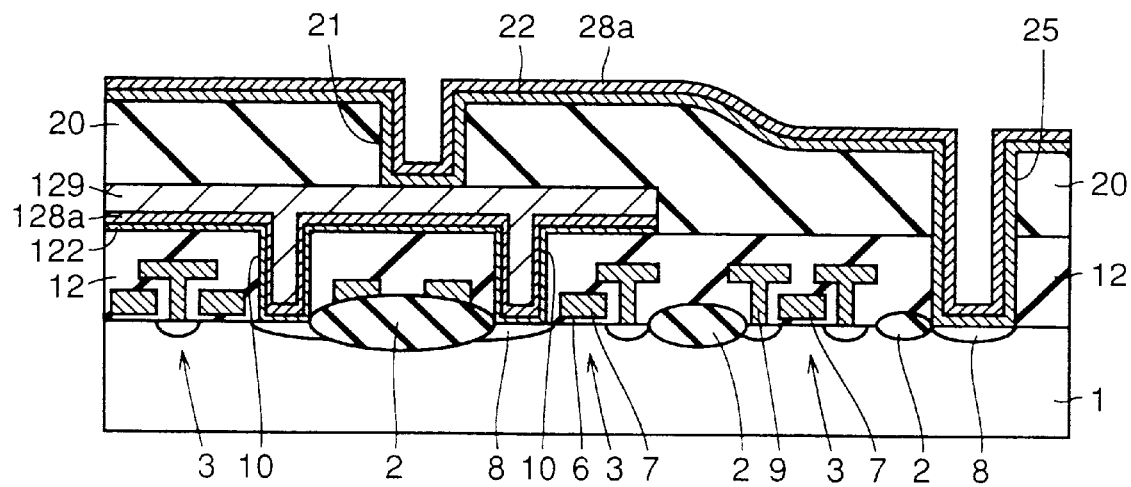

Referring to FIG. 29, a sputtering method is performed in an argon atmosphere to form adhesion layer 22 made of titanium. The adhesion layer 22 has a thickness of about 10 nm. Using titanium silicide target, barrier layer 28a made of titanium silicon nitride and having a thickness from 20 to 100 nm is formed by a sputtering method with a nitrogen partial pressure from 40 to 100% and a full pressure from 0.2 to 1.2 Pa, and is thermally processed in a nitrogen or ammonia atmosphere at a temperature from 700 to 900° C.

Figure 24:
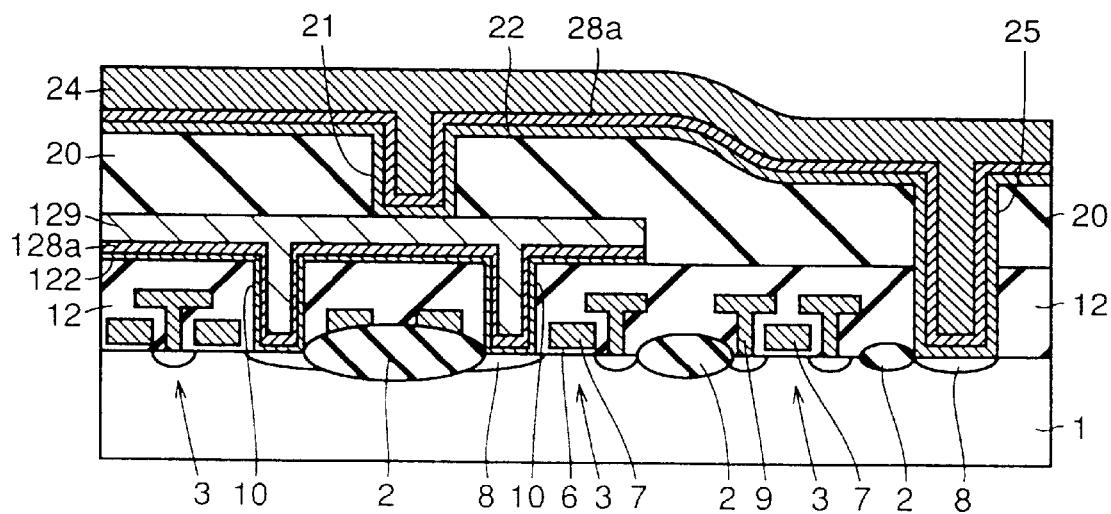
FIG. 24 is a cross section showing a conductive layer connecting structure according to an embodiment 5 of the invention.

Referring to FIG. 24, a sputtering method is performed to form an aluminum layer covering barrier layer 28a and filling contact hole 25 and through hole 21, and reflow is performed at a temperature of 490° C. to form aluminum interconnection layer 24.

In the conductive layer connecting structure of the embodiment 5 of the invention described above, since barrier layers 28a and 128a made of titanium silicon nitride are formed between aluminum interconnection layers 24 and 129 and silicon substrate 1, respectively, mutual diffusion between the aluminum and silicon does not occur even when they are heated to a high temperature. Therefore, silicon is not deposited at portions of aluminum interconnection layers 24 and 129 which are in contact with barrier layers 28a and 128a, respectively, and aluminum interconnection layers 24 and 129 are reliably connected to silicon substrate 1. Adhesion layers 22 and 122 made of titanium are formed between silicon substrate 1 and barrier layers 28a and 128a, respectively. Therefore, adhesion between silicon substrate 1 and barrier layers 28a and 128a is improved.

Embodiment 6

Figure 30:
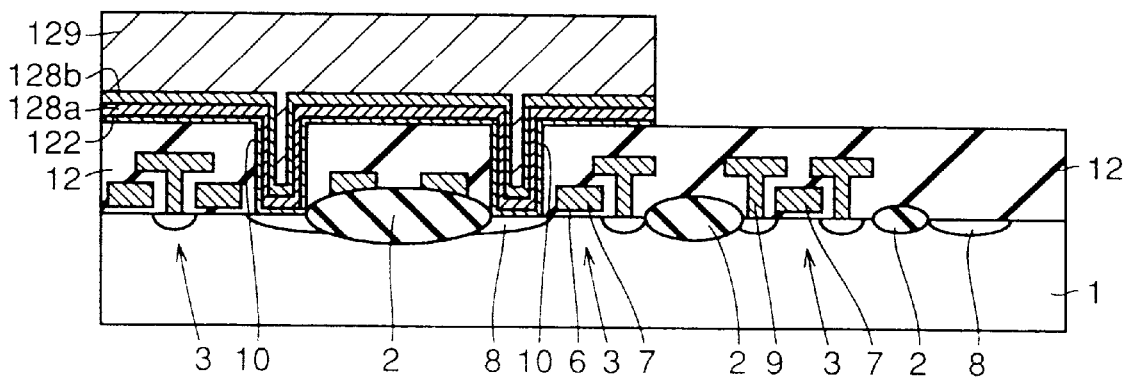
FIG. 30 is a cross section showing a conductive layer connecting structure according to an embodiment 6 of the invention.

A conductive layer connecting structure shown in FIG. 30 is similar to that of the embodiment 5 shown in FIG. 24. The conductive layer connecting structure shown in FIG. 30 differs from that shown in FIG. 24 in the following structure. Although the structure in FIG. 24 is provided with only one barrier layer, i.e., barrier layer 128, the structure in FIG. 30 is provided with two barrier layers, i.e., barrier layers 128a and 128b.

Figure 31:
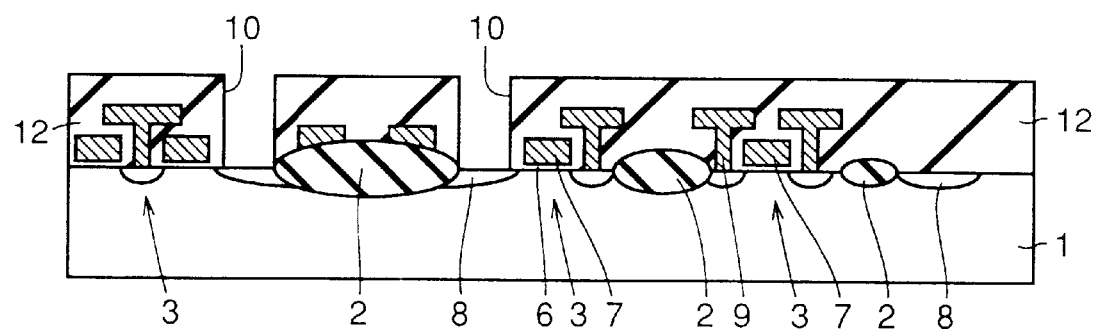
FIGS. 31 and 32 are cross sections showing 1st and 2nd steps in a method of manufacturing the conductive layer connecting structure shown in FIG. 30, respectively.

A method of manufacturing the conductive layer connecting structure shown in FIG. 30 will be described below. Referring to FIG. 31, steps are performed to form isolating oxide films 2, transfer gate transistors 3, bit lines 9 and silicon oxide film 12 similarly to those in the embodiment 1 shown in FIG. 2. Then, contact holes 10 are formed.

Figure 32:
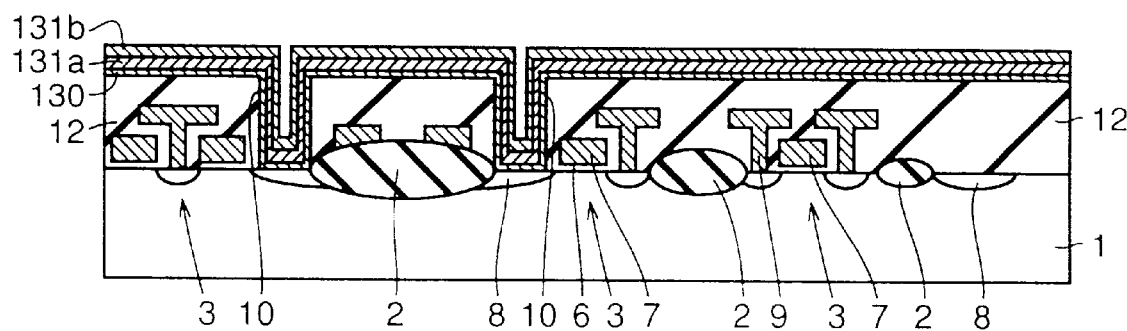
Figure 33:
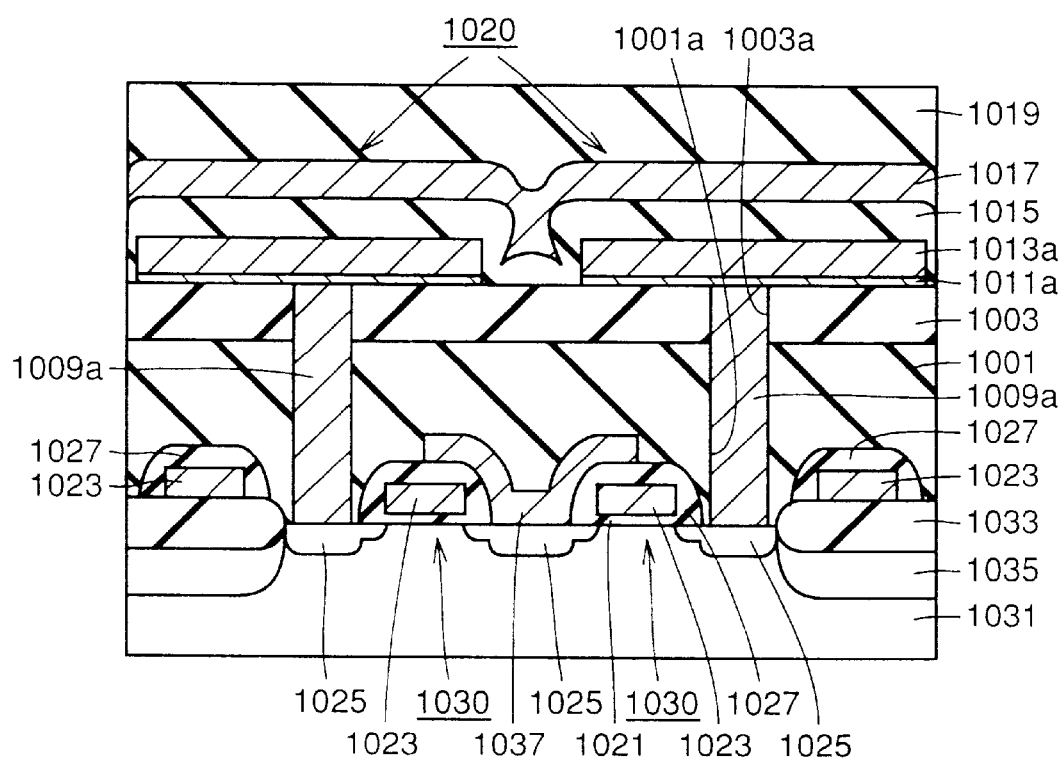
FIG. 33 is a cross section showing a conductive layer connecting structure in a conventional DRAM.
Figure 34:
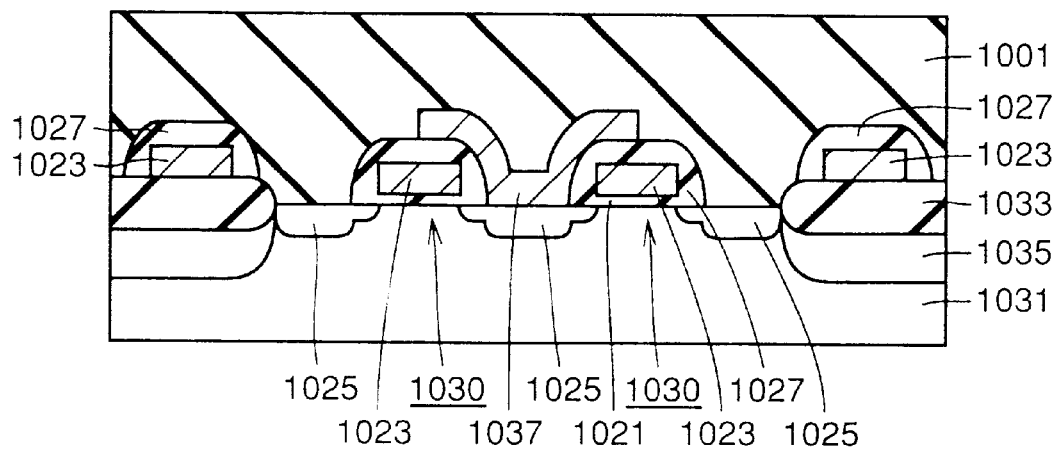
FIGS. 34 through 45 are cross sections showing 1st to 12th steps in a method of manufacturing the conductive layer connecting structure shown in the conventional DRAM shown in FIG. 33, respectively.
Figure 35:
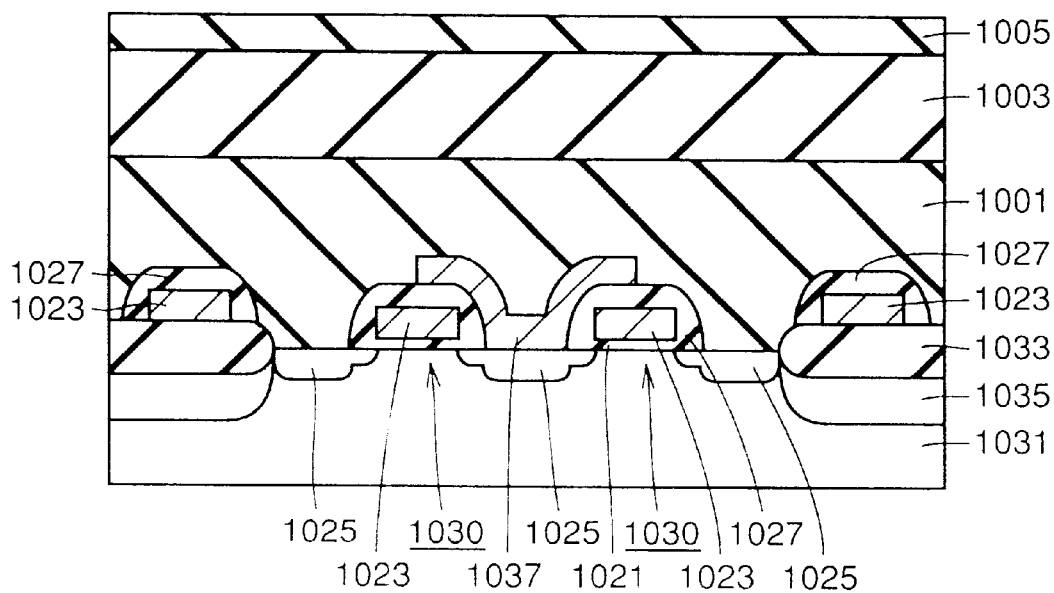
Figure 36:
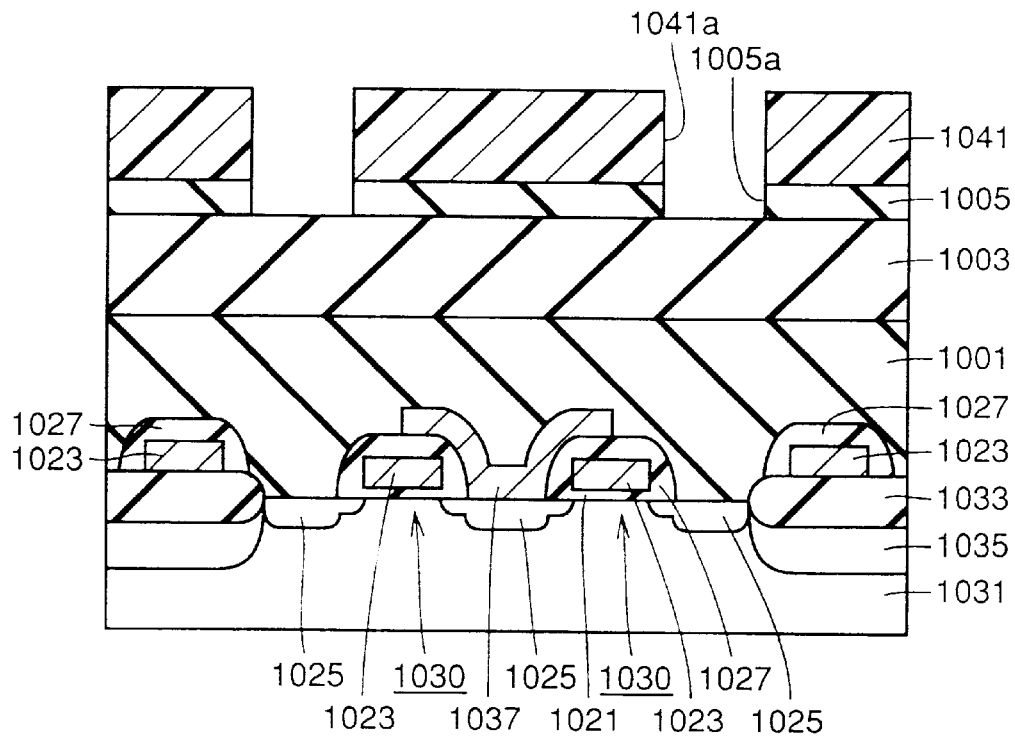
Figure 37:
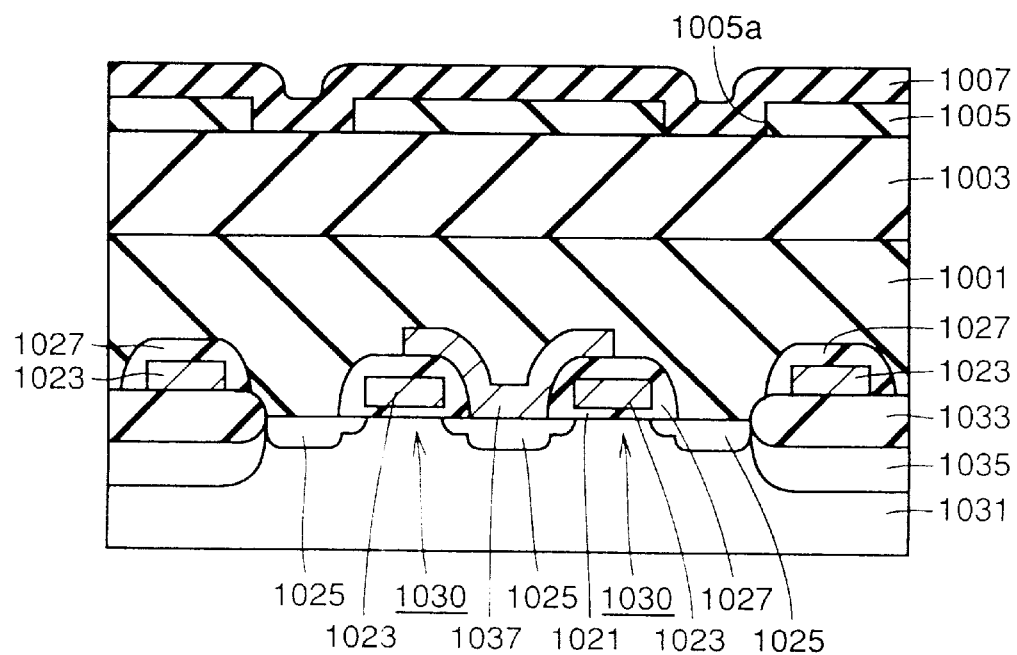
Figure 38:
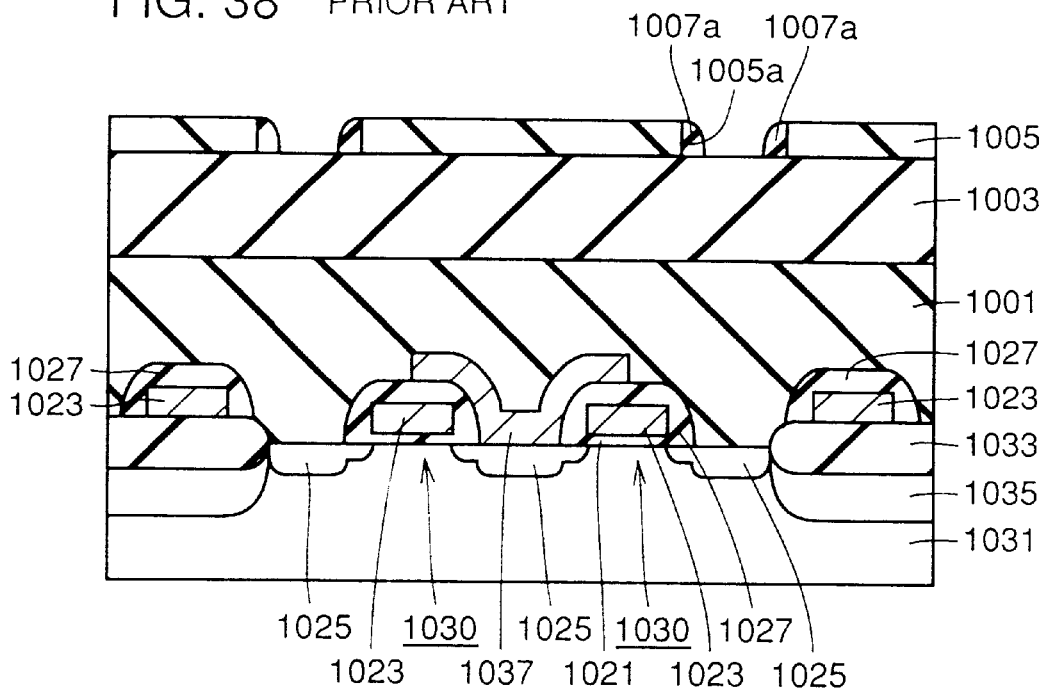
Figure 39:
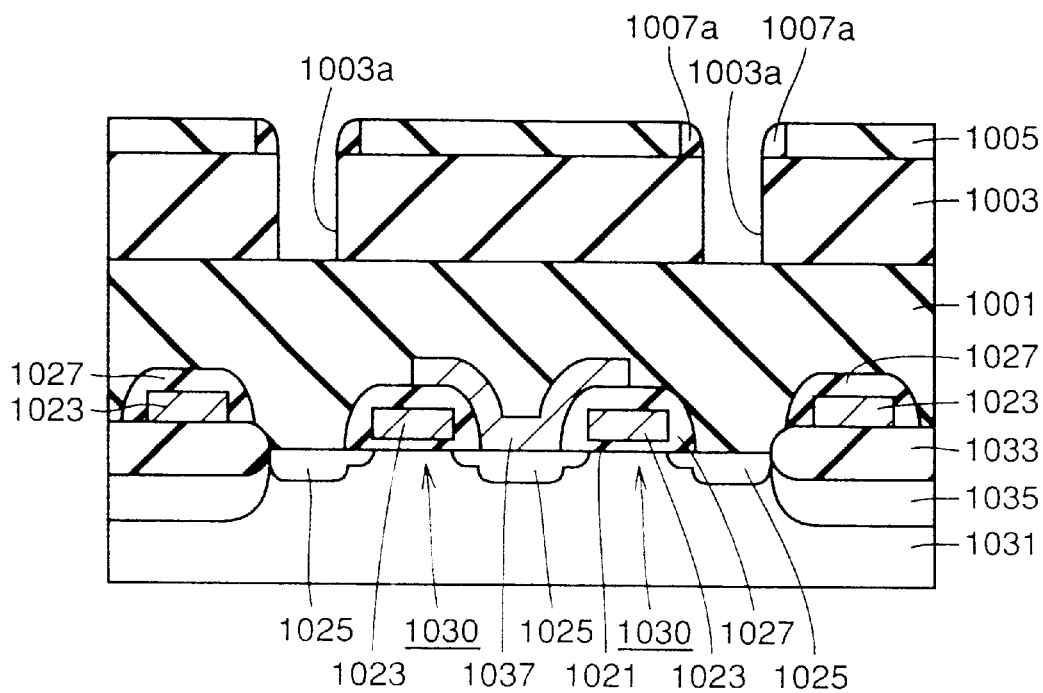
Figure 40:
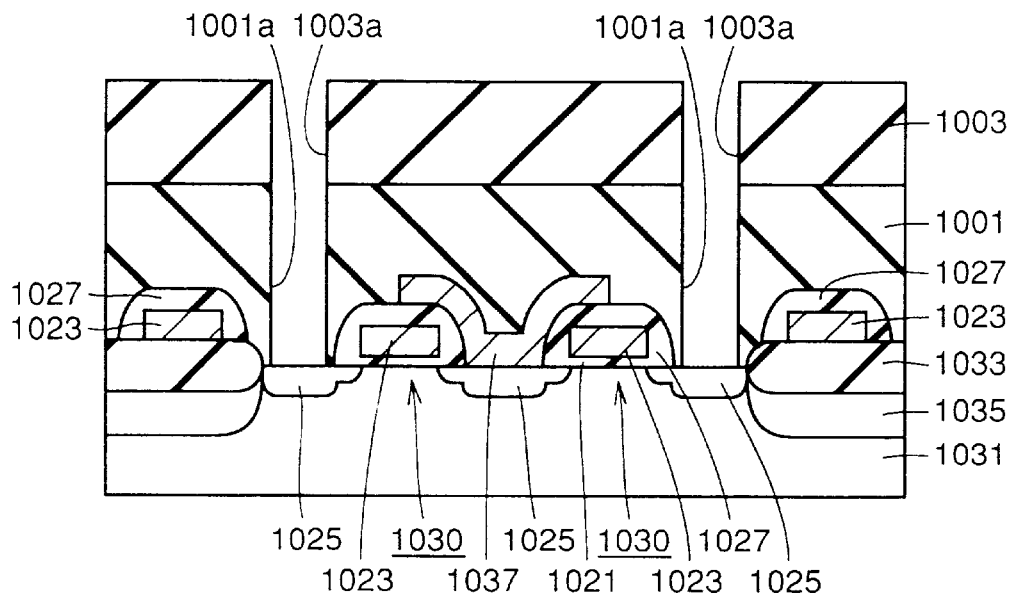
Figure 41:
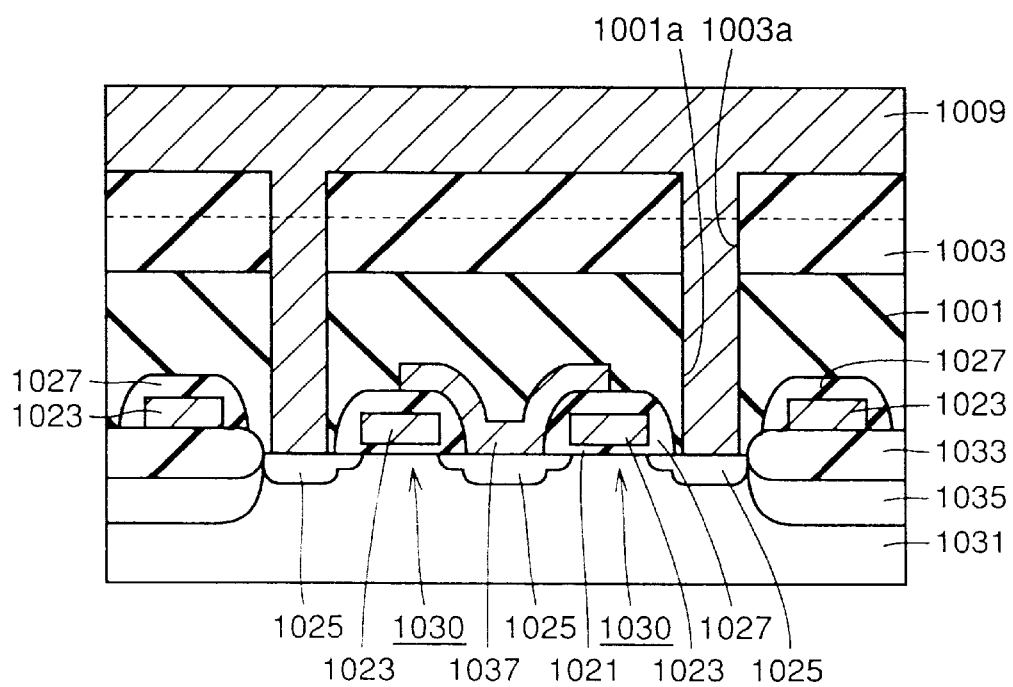
Figure 42:
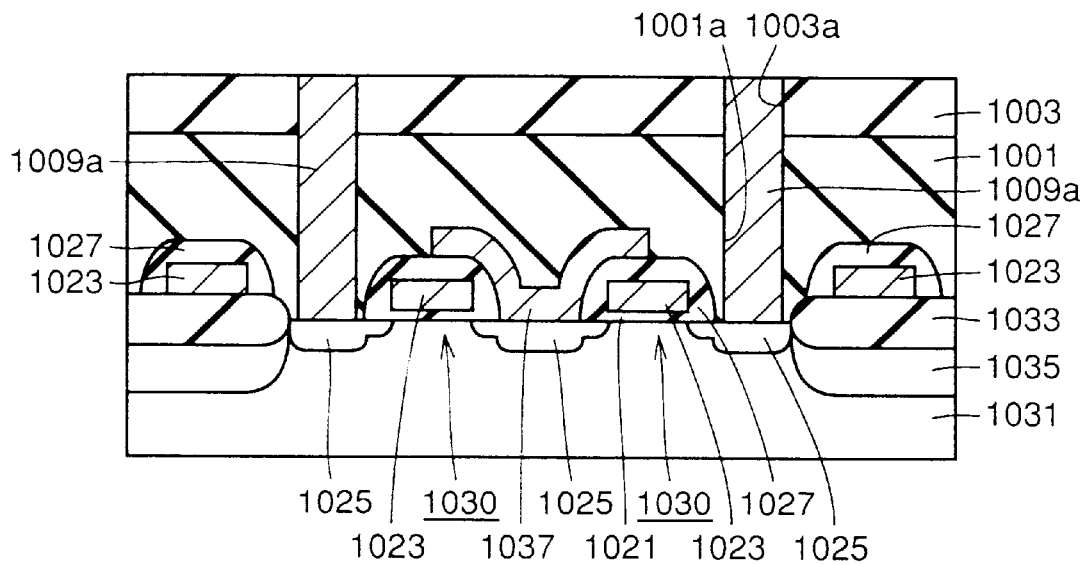
Figure 43:
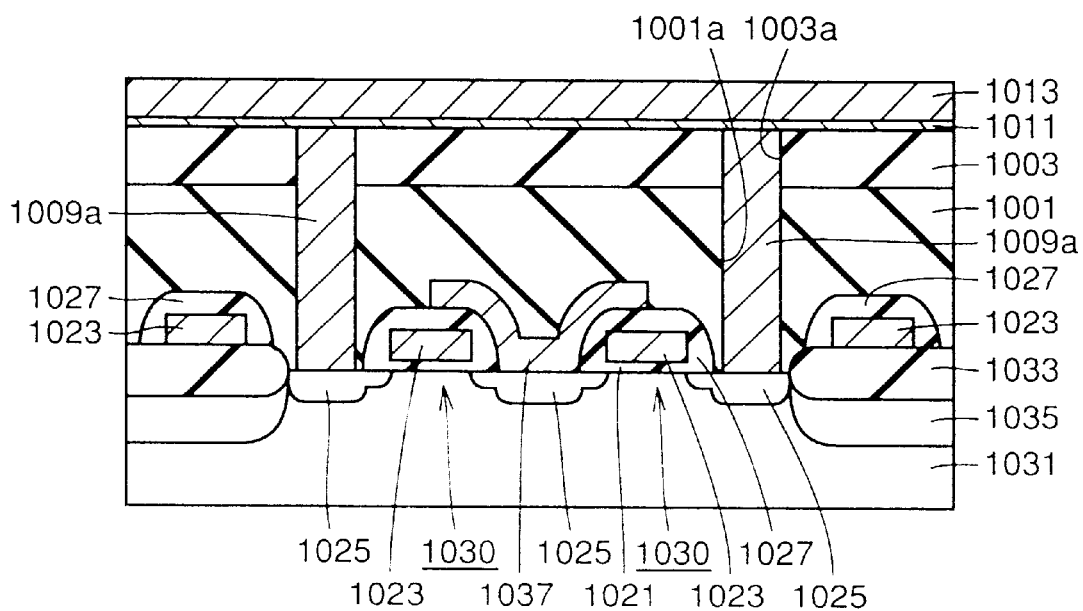
Figure 44:
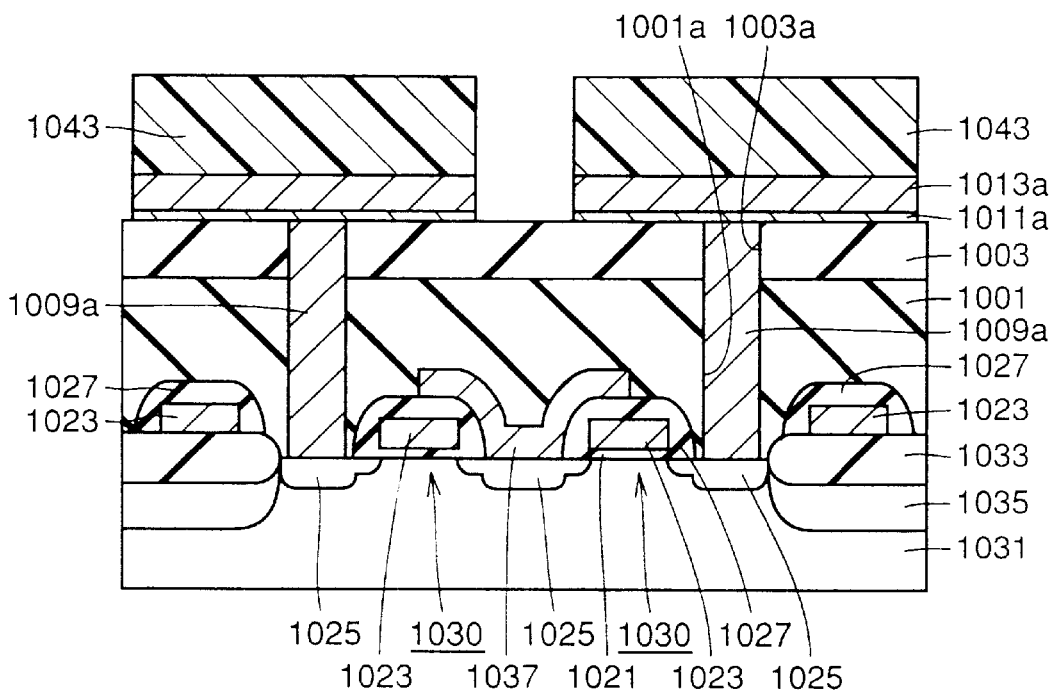
Figure 45:
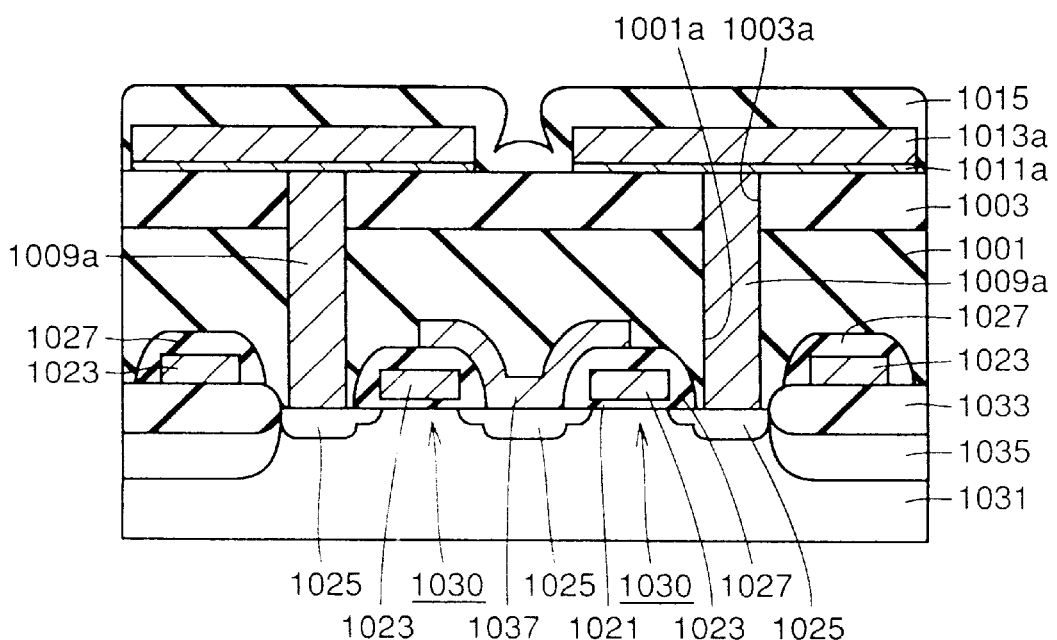
Figure 46:
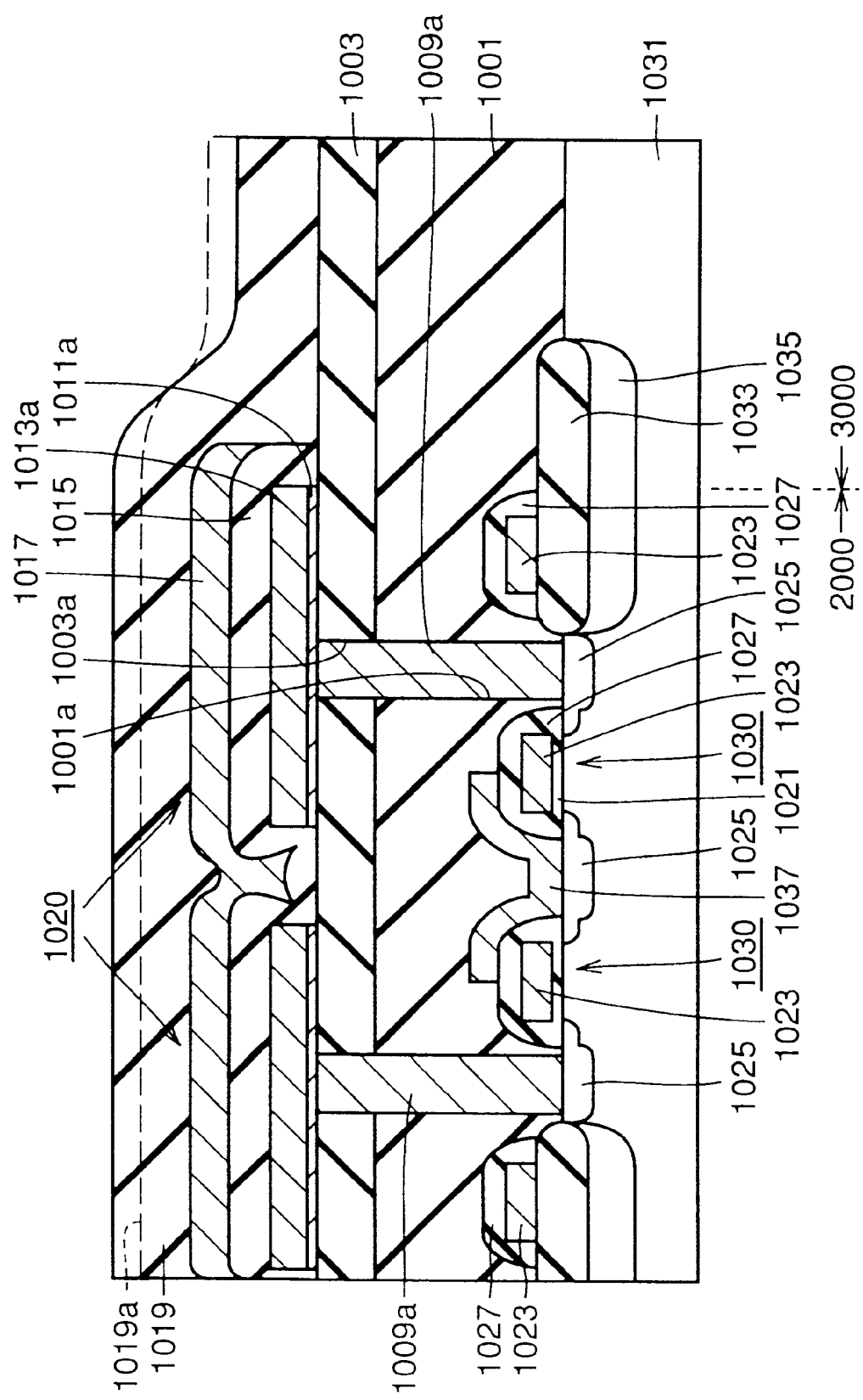
FIG. 46 is a cross section for illustrating a problem arising from the conductive layer connecting structure in the conventional DRAM.

Referring to FIG. 32, titanium layer 130 is formed by a sputtering method in an argon atmosphere. Titanium layer 130 has a thickness of about 10 nm. Using titanium silicide target, barrier layer 131a made of titanium silicon nitride from 20 to 50 nm in thickness is formed by a sputtering method with a nitrogen partial pressure from 40 to 100%, a temperature from 200 to 550° C. and a full pressure from 0.2 to 1.2 Pa, and is thermally processed in a nitrogen or ammonia atmosphere at a temperature from 700 to 900° C. This method in which nitride is produced by sputtering in a nitrogen atmosphere is called a reactive sputtering method. Titanium silicon nitride of barrier layer 131a takes the form of columnar monocrystal or amorphous as shown in FIG. 13. Using titanium silicide target, a titanium silicide film from 20 to 70 nm in thickness is formed by a sputtering method in an argon atmosphere at a pressure from 0.2 to 1.2 Pa, and is thermally processed at a temperature from 700 to 900° C. in a nitrogen or ammonia atmosphere, whereby a barrier layer 131b made of titanium silicon nitride is formed. Barrier layer 131b is formed of granular monocrystals of titanium silicon nitride as shown in FIG. 15. This method in which non-nitride is nitrided by thermal processing in nitrogen or ammonia is called a thermal nitriding method.

Referring to FIG. 30, sputtering is performed to form an aluminum layer covering barrier layer 131b and filling contact hole 10. Reflow of this aluminum layer is performed at a temperature of 490° C. Then, the aluminum layer, barrier layers 131b and 131a, and adhesion layer 130 are patterned into predetermined configurations, whereby aluminum interconnection layer 129, barrier layers 128b and 128a, and adhesion layer 122 are formed.

In the conductive layer connecting structure of the embodiment 6 of the invention described above, the barrier layer has a two-layer structure including barrier layer 128a formed of columnar crystals and barrier layer 128b formed of granular crystals. Therefore, it is possible to suppress mutual diffusion between silicon in the silicon substrate and aluminum in the aluminum interconnection layer through barrier layer 128b, so that mutual diffusion between the silicon and aluminum can be prevented further effectively.

Although the embodiments of the invention have been described, they can be modified into various forms.

Instead of titanium silicon nitride, the barrier layer may be made of silicide of other high melting point metal such as tungsten (W), tantalum (Ta), cobalt (Co) or molybdenum (Mo). The upper and lower electrode layers may be made of platinum group elements other than platinum, and, for example, may be made of iridium (Ir), osmium (Os), ruthenium (Ru), rhodium (Rh), palladium (Pd) or rhenium (Re). In the embodiments 2 and 6, although the thermal nitriding method is employed for forming the barrier layer of granular monocrystals of titanium silicon nitride, the barrier layer may be formed by a plasma nitriding method or an ECR nitriding method. Instead of aluminum interconnection layer 24 and 129, the conductive layer including titanium or tungsten may be used.

In the conductive layer connecting structure according to an aspect of the invention, since the second conductive layer containing silicon and nitrogen is formed between the first conductive layer containing silicon and the third conductive layer containing platinum group elements, mutual diffusion between silicon and platinum group elements can be prevented even when the conductive layers are heated to a high temperature.

Since the drain boundaries of the second layer containing granular crystals are complicated, mutual diffusion between silicon and platinum through the grain boundaries is prevented further effectively.

The fourth conductive layer containing high melting point metal and nitrogen is formed between the third and fifth conductive layers. Therefore, the fourth conductive layer can prevent mutual diffusion between platinum in the third conductive layer and aluminum in the fifth conductive layer.

The conductive layer connecting structure of the invention can be used in a semiconductor device having capacitors.

Silicon in the first conductive layer has a good adhesion to titanium, and high melting point metal in the second conductive layer has a good adhesion to titanium. Therefore, adhesion between the first and second conductive layers is improved.

In the conductive layer connecting structure according to another aspect of the invention, the second conductive layer containing high melting point metal, silicon and nitrogen is formed between the first conductive layer containing silicon and the third conductive layer containing platinum group elements. Therefore, mutual diffusion between silicon and platinum group elements can be prevented even when the second conductive layer is heated to a high temperature. Therefore, reaction between silicon and platinum does not occur, and a substance of a low dielectric constant such as platinum silicide or silicon dioxide is not deposited at the surface of the third conductive layer. As a result, a capacity of the capacitor does not decrease.

Since a substance of a low dielectric constant is not deposited at the surface of the lower electrode layer, a capacity of the capacitor does not decrease.

In the conductive layer connecting structure according to still another aspect of the invention, the second conductive layer containing high melting point metal, silicon and nitrogen is formed between the first conductive layer containing platinum group elements and the third conductive layer containing aluminum. Therefore, mutual diffusion between the platinum group elements and aluminum can be prevented even when the second conductive layer is heated to a high temperature.

Since mutual diffusion between the aluminum and platinum group elements does not occur, aluminum is not deposited at the surface of capacitor. Therefore, adhesion between the upper electrode layer of the capacitor and the aluminum interconnection layer does not decrease.

Tungsten, titanium or nitride of them in the plug layer has a good adhesion to both the high melting point metal in the second conductive layer and the aluminum in the third conductive layer. Therefore, the second and third conductive layers can be connected reliably. Further, a layer containing titanium is located under the third conductive layer. Therefore, the second conductive layer containing silicon or the like, which has a good adhesion to titanium, can be electrically connected to the third conductive layer.

The titanium layer and titanium nitride layer can prevent diffusion of aluminum in the third conductive layer.

In the conductive layer connecting structure according to yet another aspect of the invention, the second conductive layer containing high melting point metal, silicon and nitrogen is formed between the first conductive layer containing silicon and the third conductive layer containing aluminum. Therefore, mutual diffusion between the silicon and aluminum can be prevented even when the second conductive layer is heated to a high temperature.

Since mutual diffusion between aluminum and silicon does not occur, silicon is not deposited at the surface of the aluminum interconnection layer. Also, aluminum is not deposited at the surface of the impurity region. Therefore, the impurity region is reliably connected to the second conductive layer, and the aluminum interconnection layer is reliably connected to the second conductive layer.

Since the titanium has a good adhesion to both the silicon in the first conductive layer and the aluminum in the second conductive layer, the first and second conductive layers can be reliably connected together.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A conductive layer connecting structure comprising:
   a first conductive layer containing silicon;
   a second conductive layer containing high melting point metal, silicon and nitride, and formed on said first conductive layer, wherein said second conductive layer has a two-layer structure of a first layer containing columnar crystals or amorphous and a second layer containing granular crystals; and
   a third conductive layer containing platinum group element, and formed on said second conductive layer.

2. The conductive layer connecting structure according to claim 1, further comprising:

a fourth conductive layer formed on said third conductive layer and containing high melting point metal and nitrogen; and a fifth conductive layer formed on said fourth conductive layer and containing at least one kind of metal selected from a group consisting of aluminum, tungsten and titanium.

3. The conductive layer connecting structure according to claim 1, wherein said high melting point metal is at least one kind of metal selected from a group consisting of titanium, tungsten, tantalum, cobalt and molybdenum.

4. The conductive layer connecting structure according to claim 1, wherein said first conductive layer is connected to an impurity region formed at a semiconductor substrate, and said third conductive layer forms a lower electrode layer of a capacitor.

5. The conductive layer connecting structure according to claim 1, wherein a layer containing titanium is formed between said first and second conductive layers.

6. The conductive layer connecting structure according to claim 1, further comprising:

an impurity region formed at a main surface of said semiconductor substrate;

a dielectric layer formed on said third conductive layer; and a fourth conductive layer containing platinum group elements, and formed on said dielectric layer, wherein said first conductive layer is electrically connected to said impurity region.

7. A conductive layer connecting stricture comprising:

a first conductive layer containing silicon;

a second conductive layer containing high melting point metal, silicon and nitrogen, and formed on said first conductive layer; and a third conductive layer formed of metal or an alloy containing at least one kind metal selected form a group consisting of aluminum, tungsten and titanium, and formed on said second conductive layer.

8. The conductive layer connecting structure according to claim 7, wherein said second conductive layer has a two-layer structure of a first layer containing columnar crystals or amorphous and a second layer containing granular crystals.

9. The conductive layer connecting structure according to claim 7, wherein said high melting point metal is at least one kind of metal selected from a group consisting of titanium, tungsten, tantalum, cobalt and molybdenum.

10. The conductive layer connecting structure according to claim 7, wherein said first conductive layer is an impurity region formed at a semiconductor substrate, and said third layer is an aluminum interconnection layer.

11. The conductive layer connecting structure according to claim 7, wherein a layer containing titanium is formed between said first and second conductive layers.

12. A conductive layer connecting structure comprising:

a first conductive layer containing a platinum group element comprising at least one of platinum, iridium, osmium, ruthenium, rhodium, palladium and rhenium;

a second conductive layer containing a high melting point metal, silicon and nitrogen, and formed on said first conductive layer; and a third conductive layer containing at least one kind of metal selected from a group consisting of aluminum, tungsten and titanium, and formed on said second conductive layer, wherein said first conductive layer is an upper electrode of a capacitor, and said third conductive layer is an aluminum interconnection layer.

13. The conductive layer connecting structure of claim 12, wherein said high melting point metal is at least one kind of metal selected from a group consisting of titanium, tungsten, tantalum, cobalt and molybdenum.

14. A conductive layer connecting structure comprising:

a first conductive layer containing a platinum group element comprising at least one of platinum, iridium, osmium, ruthenium, rhodium, palladium and rhenium;

a second conductive layer containing a high melting point metal, silicon and nitrogen, and formed on said first conductive layer;

an insulating layer formed said second conductive layer and having an aperture exposing the surface of said second conductive layer; and a third conductive layer containing at least one kind of metal selected from a group consisting of aluminum, tungsten and titanium, and formed on said second conductive layer, wherein said third conductive layer formed on said second conductive layer is electrically connected to said second conductive layer through said aperture.

15. The conductive layer connecting structure of claim 14, wherein said high melting point metal is at least one kind of metal selected from a group consisting of titanium, tungsten, tantalum, cobalt and molybdenum.

16. The conductive layer connecting structure of claim 14, further comprising a plug layer filling said aperture and made of at least one kind of substance selected from a group consisting of tungsten, titanium and nitrides of the same, said second and third conductive layers being electrically connected together via said plug layer.

17. A conductive layer connecting structure comprising:

a first conductive layer containing a platinum group element comprising at least one of platinum, iridium, osmium, ruthenium, rhodium, palladium and rhenium;

an insulating layer formed on said first conductive layer and having an aperture exposing the surface of said first conductive layer;

a second conductive layer containing a high melting point metal, silicon and nitrogen, and formed on said first conductive layer; and a third conductive layer containing at least one kind of metal selected from a group consisting of aluminum, tungsten and titanium, and formed on said second conductive layer, wherein said second conductive layer formed on said first conductive layer is electrically connected to said first conductive layer through said aperture.

18. The conductive layer connecting structure of claim 17, wherein said high melting point metal is at least one kind of metal selected from a group consisting of titanium, tungsten, tantalum, cobalt and molybdenum.

* * * * *